United States Patent
Li et al.

(10) Patent No.: US 9,252,712 B2
(45) Date of Patent: Feb. 2, 2016

(54) HARDWARE-EFFICIENT SIGNAL-COMPONENT SEPARATOR FOR OUTPHASING POWER AMPLIFIERS

(71) Applicants: Yan Li, Cambridge, MA (US); Zhipeng Li, Cambridge, MA (US); Yehuda Avniel, Cambridge, MA (US); Alexandre Megretski, Concord, MA (US); Vladimir Marko Stojanovic, Lexington, MA (US)

(72) Inventors: Yan Li, Cambridge, MA (US); Zhipeng Li, Cambridge, MA (US); Yehuda Avniel, Cambridge, MA (US); Alexandre Megretski, Concord, MA (US); Vladimir Marko Stojanovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/400,061

(22) PCT Filed: May 10, 2013

(86) PCT No.: PCT/US2013/040483
§ 371 (c)(1),
(2) Date: Nov. 10, 2014

(87) PCT Pub. No.: WO2013/170116
PCT Pub. Date: Nov. 14, 2013

(65) Prior Publication Data
US 2015/0124907 A1 May 7, 2015

Related U.S. Application Data

(60) Provisional application No. 61/645,096, filed on May 10, 2012.

(51) Int. Cl.
*H03D 1/24* (2006.01)
*H03F 1/02* (2006.01)
(Continued)

(52) U.S. Cl.
CPC .......... *H03F 1/0205* (2013.01); *G06F 17/5068* (2013.01); *H03F 1/0294* (2013.01);
(Continued)

(58) Field of Classification Search
CPC .................................................. H03F 1/0205
USPC ........................................................ 375/320
See application file for complete search history.

(56) References Cited

U.S. PATENT DOCUMENTS

| 5,995,550 A | 11/1999 | Xu et al. |
| RE37,488 E | 12/2001 | Broomhead et al. |
| 7,467,174 B2 | 12/2008 | Wang et al. |

OTHER PUBLICATIONS

PCT International Preliminary Report on Patentability of the ISA for PCT/US2013/040483 dated Nov. 20, 2014.
(Continued)

*Primary Examiner* — Lihong Yu
(74) *Attorney, Agent, or Firm* — Daly, Crowley, Mofford & Durkee, LLP

(57) ABSTRACT

Described herein is a fixed-point piece-wise linear (FP PWL) approximation technique for computations of nonlinear functions. The technique results in circuit designs having relatively few and simple arithmetic operations, short arithmetic operands and small-sized look-up tables and the circuits resultant there from can be efficiently pipelined to run at multi-GSamples/s throughputs. In one exemplary embodiment, the FP PWL approximation technique was used in the design of an energy-efficient high-throughput and high-precision signal component separator (SCS) for use with in an asymmetric-multilevel-outphasing (AMO) power amplifier. The FP PWL approximation technique is appropriate for use in any application requiring high-throughput, area and power constrained hardware implementations of nonlinear functions.

8 Claims, 16 Drawing Sheets

(51) Int. Cl.
  *G06F 17/50* (2006.01)
  *H03F 3/19* (2006.01)
  *H03F 3/24* (2006.01)
  *H04L 25/03* (2006.01)
  *H04L 27/06* (2006.01)

(52) U.S. Cl.
  CPC ............... *H03F 3/19* (2013.01); *H03F 3/245* (2013.01); *H04L 25/03* (2013.01); *H04L 27/06* (2013.01); *H03F 2200/336* (2013.01); *H03F 2200/451* (2013.01)

(56) References Cited

OTHER PUBLICATIONS

Li, et al.; "High-Throughput Signal Component Separator for Asymmetric Mulit-Level Outphasing Power Amplifiers;" Journal of Solid-State Circuits; vol. 48; No. 2; Feb. 2013; pp. 369-380.

PCT Search Report of the ISA for PCT/US13/40483 dated Dec. 2, 2013.

PCT Written Opinion of the ISA for PCT/US13/40483 dated Dec. 2, 2013.

PCT Invitation to Pay Additional Fees for PCT/US13/40483 dated Oct. 10, 2013.

HARDWARE-EFFICIENT SIGNAL-COMPONENT SEPARATOR FOR OUTPHASING POWER AMPLIFIERS

CROSS REFERENCE TO RELATED APPLICATIONS

This application is a U.S. National Stage entry under 35 U.S.C. §371 of PCT Application No. PCT/US2013/040483, filed May 10, 2013 and published in the English language and, which claims the benefit of U.S. provisional application No. 61/645,096 filed May 10, 2012, which applications are hereby incorporated herein by reference in their entireties.

STATEMENT REGARDING FEDERALLY SPONSORED RESEARCH

This invention was made with government support under Grant No. W911NF-10-1-0088 awarded by the Army Research Office. The government has certain rights in this invention.

FIELD OF THE INVENTION

The concepts described herein relate to circuits and systems which make use of non-linear functions and more particularly to techniques for hardware implementations of such circuits and systems.

BACKGROUND OF THE INVENTION

As is known in the art, the availability of large portions of bandwidth coupled with the maturity of complementary metal oxide semiconductor (CMOS) process technology presents an opportunity to address applications having relatively high bandwidth demands including, but not limited to, communication applications. There has thus been a trend toward developing high-throughput wireless communication systems which operate in the millimeter-wave (mm-wave) frequency range (e.g. in the range of about 60 GHz to about 90 GHz).

As is also known, such mm-wave applications place great technical challenges on the design of a transceiver, due to factors such as power amplifier (PA) efficiency and linearity, high wireless channel loss and multipath, increasing parasitic effects for passive components, limited amplifier gain etc. In the development of state-of-the-art cellular base stations, for example, there is a drive toward providing base stations which include radios provided as integrated circuits (or "chips") which are compatible with multiple standards (so-called multi-standard radio chips). This further increases the need for high-precision, high-throughput and energy-efficient backend processing.

The desire to best leverage available portions of the frequency spectrum for these and other high-throughput applications, results in a need for power amplifiers (PAs) having high-efficiency and high-linearity operating characteristics. While these conflicting PA design requirements have been satisfied in the past at low system throughputs by designing smart digital back-ends, the multi-giga samples/second (GSamples/s) throughput required in state-of-the-art applications places a significant challenge on digital baseband system design to perform the necessary modulation and predistortion operations at negligible power overhead.

This need for high-throughput, energy-efficient digital baseband systems becomes particularly important for outphasing PAs designed to improve efficiency while at the same time satisfying high-linearity requirements needed for higher-order signal constellations. At low throughputs (e.g. throughputs in the range of about 10 MSamples/s to about 100 MSamples/s), outphasing PAs rely upon relatively complex digital signal processing to generate outphasing vectors and make it possible to use relatively simple, high-efficiency switching PAs on each amplifying signal path of the outphasing PA.

Examples of such outphasing PAs include so-called linear-amplification-by-nonlinear-component (LINC) PAs, and asymmetric-multilevel-outphasing (AMO) PAs. Outphasing PA systems include a signal component separator (SCS) which decomposes an original sample signal fed to an input thereof into two signals as required by the outphasing systems (e.g. LINC/AMO systems, for example). Such decomposition involves the computations of several nonlinear functions.

At relatively high throughputs (e.g. throughputs in the multi-GSamples/s range), however, a radical redesign of the signal component separator (SCS) digital signal processing implementations is needed to prevent degradation in net power efficiency due to significant increase of digital baseband power consumption.

Conventional LINC signal component separators (SCSs) have been implemented as both analog and digital circuits. The analog circuit versions of SCSs are not suitable for high-speed and high-precision applications leaving digital SCS implementations as a practical option for use in high throughput applications.

For digitally implemented SCS, a look-up-table (LUT) is the most common way to realize the nonlinear functions. Conventional signal separators operate primarily below the range of 100 MSamples/s with low to medium precision and thus, an LUT approach is a relatively simple and energy-efficient approach. Even for AMO architectures, an LUT approach is still a preferable choice for operations under 100 MSamples/s. However, a traditional LUT-based function map quickly becomes infeasible when the throughput and precision requirements rise to multi-GSamples/s and more than a 10-bit range. Indeed, LUT size becomes prohibitively large for on-chip implementations and thus the LUT approach falls to meet the needs of state-of-the-art systems both in terms of the amount of area required and speed characteristics.

Furthermore, the number of LUTs used in an AMO SCS is significantly larger than in a LINC SCS. Thus, LUT solutions that work for LINC systems render AMO implementations infeasible. And while a direct nonlinear function synthesis approach (e.g. via iterative algorithms such as a coordinate rotation digital computer (CORDIC) technique or nonlinear filters are possible and proves to be relatively area compact, at such high throughputs, these approaches suffer from a prohibitive power footprint for the overall power efficiency of the PA.

SUMMARY OF THE INVENTION

In accordance with the concepts, systems, circuits and techniques described herein a fixed point, piece-wise-linear (FP PWL) fitting technique is described. The FP PWL fitting technique described herein can be used in any system making use of non-linear functions. Utilizing the FP PWL fitting technique described herein in the design of a circuit which implements a nonlinear function results in a circuit having the highest performance for the same circuitry designed using other techniques. Alternatively, use of the FP PWL fitting technique described herein results in a circuit having the simplest circuit implementation for a given performance.

The FP PWL technique can be applied to nonlinear blocks in amplifiers and other circuits including, but not limited to radio frequency (RF) receivers, signal processors and other circuits. The FP PWL fitting technique also leads to the ability to provide circuits having high-throughput and small-footprint characteristics.

In accordance with a further aspect of the concepts, systems, circuits and techniques described herein, a signal component separator (SCS) is implemented utilizing a fixed point piece-wise linear (FP PWL) function.

With this particular arrangement, an SCS which provides a balance between accuracy, power and area is provided. In one embodiment, a signal component separator (SCS) having energy-efficient, high-throughput and high-precision operating characteristics for use with an asymmetric-multilevel-outphasing (AMO) power amplifier (PA) is provided.

In one embodiment, the SSC is implemented as an integrated circuit (i.e. a "chip"). The SCS uses a fixed-point, piece-wise linear functional approximation developed to improve hardware efficiency of outphasing signal processing functions. In one exemplary embodiment, an integrated circuit is fabricated using a 45 nm silicon on insulator (SOI) complementary metal-oxide semiconductor (CMOS) process and the SCS consumes an active area of 1.5 square millimeters ($mm^2$). In one embodiment, the technique enables an SCS to operate at a throughput of 3.4 GSamples/s while producing phases with 12-bit accuracy.

Compared with conventional AMO SCS implementations, the technique described herein can improve design area efficiency by up to 40% or more and can improve energy-efficiency by a factor of up to five (5×) or more. Such a fast, high-precision SCS enables a new class of high-throughput mm-wave transmitters capable of operating with high-energy efficiency, high throughput and high-spectral efficiency.

In accordance with a further aspect of the concepts, systems and techniques described herein, a set of procedures and design steps to efficiently implement nonlinear functions for use in applications which require hardware implementations of nonlinear functions includes (a) obtaining a floating point version of a piece-wise linear (PWL) approximation; for each interval obtaining a fixed point value; corresponding to the most significant bits of the function value; obtaining a second fixed point compensation value; and obtaining a fixed point slope value for each interval.

With this particular arrangement, a set of procedures and design steps to implement nonlinear signal processing functions in a circuit having an area and power footprint which is relatively small compared with the area and power footprint of conventional circuits is provided. Having a relatively small area and power footprint is essential to achieve overall power amplifier power efficiency and cost, while achieving throughputs well into the multi-GigaSample/second range. Such throughputs more than matches the needs in a wide spectrum of radio data communications, cell phone, Wi-Fi, WiMax and satellite communications. In one embodiment, the process is utilized to provide an SCS for use with outphasing power amplifiers.

The concepts, systems and techniques described herein find use in applications which require outphasing power amplifiers having high-linearity and high-throughput operating characteristics. Such high-linearity, high-throughput outphasing power amplifiers are used today in a range of radio applications, including, but not limited to cell phone applications, Wi-Fi/Wi-Max base stations and satellite communications. Outphasing amplifiers used in such applications require significant amounts of digital or analog signal processing in the baseband to decompose the desired transmission signal into the signals suitable for the outphasing amplifiers.

It should, of course, be appreciated that the same procedures and design steps are generally applicable to all high-throughput, area and power constrained hardware implementations of nonlinear functions (i.e. the concepts, systems and techniques described herein find use in outphasing PAs as well as in any application in need of high-throughput, area and power constrained hardware implementations of nonlinear functions).

It should be appreciated that state-of-the-art linear-amplification-by-nonlinear-component (LINC) and asymmetric-multilevel-outphasing (AMO) power amplifier signal processing blocks operate at relatively low throughputs (e.g. 40-50MSamples/sec) and low resolutions (e.g. up to 8 bits).

The concepts, systems and techniques described herein allow improvements over these state-of-the-art approaches by reducing the amount of chip area needed. In one exemplary embodiment (in an implementation in silicon) the amount of chip area is reduced by a factor in the range of about 10 to about 100 at a ten times (10×) reduction in power consumption and a forty times (40×) increase in throughput.

It should thus be appreciated that the present concepts, systems and techniques described herein find use in a wide variety of applications including a wide variety of commercial and non-commercial applications. The commercial applications are extremely broad, as indicated above, from cell phone base stations, to Wi-Fi, Wi-Max, and satellite communications, to emerging mm-wave short-range 60 GHz wireless, 70 GHz imaging and automotive radar.

The function synthesis techniques and a corresponding chip implementation, designed using an alternative approach to compute the nonlinear functions, which is both more area and energy-efficient than state-of-the-art methods like LUTs, CORDIC or nonlinear filters. In one exemplary embodiment, an integrated circuit (i.e. a chip) was built and tested. The chip test results demonstrate an AMO SCS working at 3.4 GSamples/s with 12-bit accuracy and over 2× energy savings and 25× area savings compared to traditional AMO SCS implementation.

The approach to compute a non-linear function described herein is based upon a piece-wise linear (PWL) approximation of the nonlinear function. The approximation is provided from computations of LUT, add, and multiply. To reduce (or in some cases, even minimize) computational cost while at the same time maintaining high accuracy and throughput, described is a technique to find a fixed-point representation of the approximation with one purpose of the fixed-point version of the approximation being to use as few operations as possible and reduce (or in some cases, even minimize), the number of input bits to all operations so as to achieve high throughput.

By using such an approach, it is possible to achieve a fixed-point representation of circuit nonlinear functions, which comprises one relatively small LUT, one adder and one multiplier. The hardware architecture derived from this technique achieves an advantageous balance among area, energy-efficiency, throughput and computation accuracy.

BRIEF DESCRIPTION OF THE DRAWINGS

The foregoing features of the concepts, systems and techniques described herein, as well as the concepts, systems and techniques themselves, may be more fully understood from the following description of the drawings in which.

DETAILED DESCRIPTION OF THE PREFERRED EMBODIMENTS

Figure 1A:
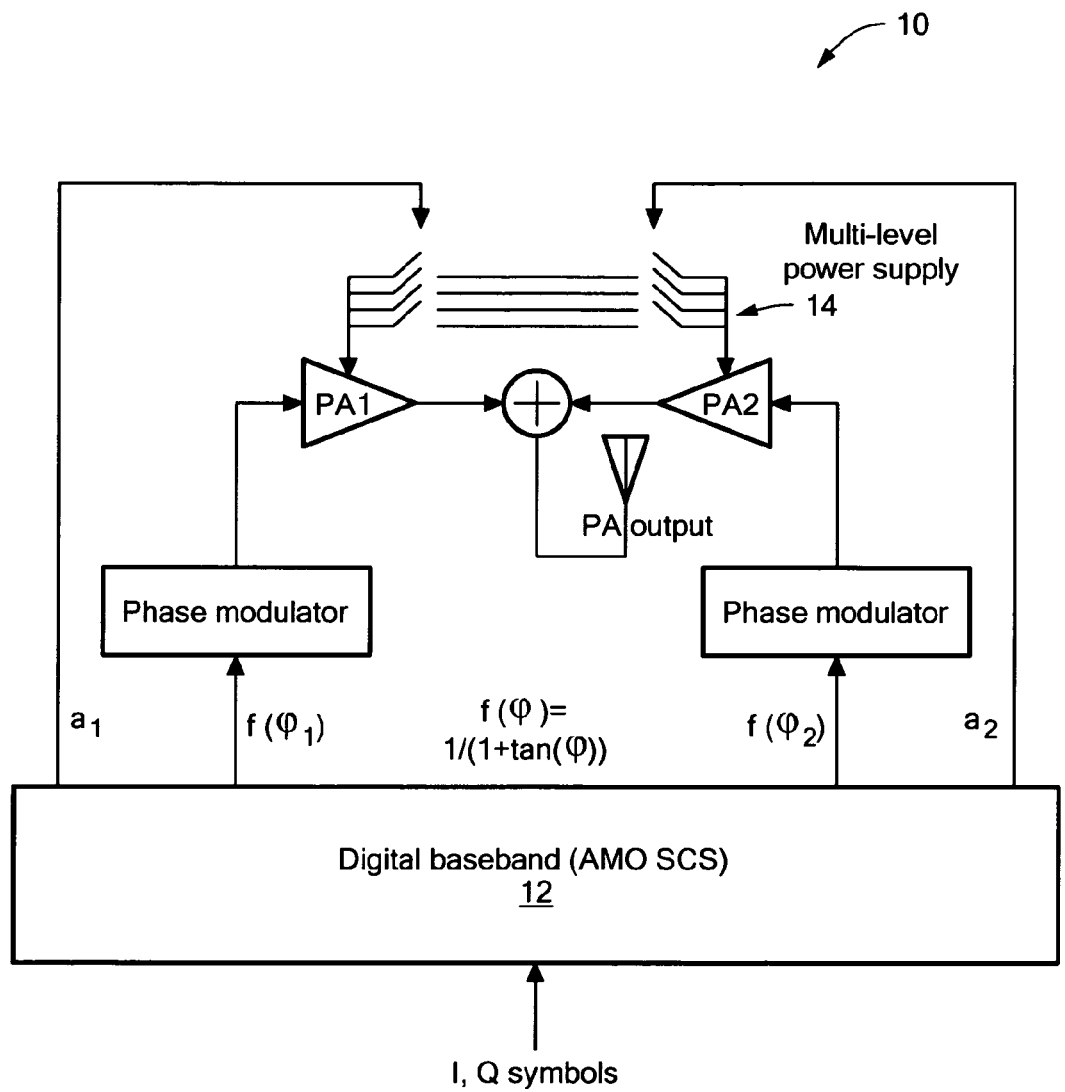
FIG. 1A is a block diagram of an asymmetric outphasing multi-level (AMO) architecture having an AMO signal component separator (SCS) implemented using a fixed-point, piece-wise linear functional approximation developed to improve hardware efficiency of outphasing signal processing functions.

Before describing a technique to compute a nonlinear function based upon a fixed point piece-wise linear (FP PWL) approximation of the nonlinear function some introductory concepts and terminology are explained.

It should be appreciated that, in an effort to promote clarity in the below description of the broad concepts described herein, reference is made herein to use of the FP PWL approximation technique in the context of a signal component separator (SCS). Such references to an SCS are not intended to be, and should not be construed as limiting. Rather, it should be understood that the broad concepts, systems and techniques described herein find use in a wide variety of different applications. In particular, the FP PWL techniques described herein may find use in any application in need of hardware implementations of nonlinear functions. The FP PWL techniques described herein may be particularly useful in any application in need of high-throughput, area and power constrained implementations of nonlinear functions.

Reference is also made herein to use of the FP PWL approximation technique to provide an SCS as part of an asymmetric-multilevel-outphasing (AMO) power amplifier (PA) system. It should be understood that such reference to an SCS or to an AMO SCS is intended as exemplary only and should not be construed as limiting the use of an SCS or the FP PWL approximation techniques as described herein to use only with an SCS or with an AMO PA.

The concepts, systems and techniques described herein related to FP PWL implementations of nonlinear functions find use in a wide variety of applications including a wide variety of commercial and non-commercial applications including, but not limited to cell phone base stations, Wi-Fi, Wi-Max, and satellite communications, mm-wave short-range wireless, imaging and automotive radar. For example, although the FP PWL approximation technique is sometimes described herein within the context of an AMO SCS, the FP PWL approximation techniques described herein are directly applicable to LINC SCS, and enable a new class of wideband wireless mm-wave communication system designs having energy and spectral efficiency which are greater than energy and spectral efficiencies of conventional techniques.

Accordingly, those of ordinary skill in the art will appreciate that the FP PWL approximation techniques and the use of such techniques to develop an SCS in the context of outphasing circuits is illustrative only and is not intended as and should not be construed as limiting and that FP PWL approximation techniques described herein could equally be used with other types of circuits (i.e. other than SCS or outphasing circuits) to implement a wide range of different types of non-linear functions.

With respect to the SCS circuits and their use with outphasing amplifiers, it should be appreciated that both linear-amplification-by-nonlinear-component (LINC) and AMO power amplifiers (PAs) are considered to be outphasing PA architectures and their digital basebands perform similar computations. LINC PA architectures have been described with the motivation to relieve the ever existing trade-off between power efficiency and linearity performances of a PA. By decomposing a transmitted signal into two constant-amplitude signals, relatively high-efficiency PAs can be used to amplify the two decomposed signals without sacrificing linearity.

Turning now to FIG. 1A. an AMO PA 10 includes an SCS 12 provided in accordance with the FP PWL approximation techniques described herein. The SCS 12 receives I, Q symbols at an input thereof and decomposes the I, Q signals to provide phase and amplitude signals $a_1$, $\phi_1$ $a_2$, $\phi_2$, In a LINC system, the amplitudes $a_1$, and $a_2$ are equal. The outphasing angles $\phi_1$, $\phi_2$ for both LINC SCS and AMO SCS architectures may be derived in manner described below in conjunction with Table I. Suffice it here to say that the phase signals $\phi_1$, $\phi_2$ are coupled through respective ones of a pair of phase modulators to respective ones of a pair of power amplifiers denoted as PA1, PA2 in FIG. 1A. Amplitude signals $a_1$, and $a_2$ are coupled to separate inputs of a multilevel supply 14.

AMO PA architectures, such as that shown in FIG. 1A, improve average power efficiency further by allowing the two PAs (i.e. PA1 and PA2 in FIG. 1A) to switch among a discrete set of power supplies rather than fixing on a single supply level. In the exemplary embodiment of FIG. 1A, the multilevel supply provides four discrete signals. Those of ordinary skill in the art will appreciate, of course, that in other embodiments a multilevel power supply may provide fewer or more that four discrete signals. In response to signals $a_1$, and $a_2$ the multilevel supply provides selected ones of a discrete set of power supplies signals (shown as four discrete signals in the exemplary embodiment of FIG. 1A) to inputs of the respective power amplifiers PA1, PA2.

Figure 1B:
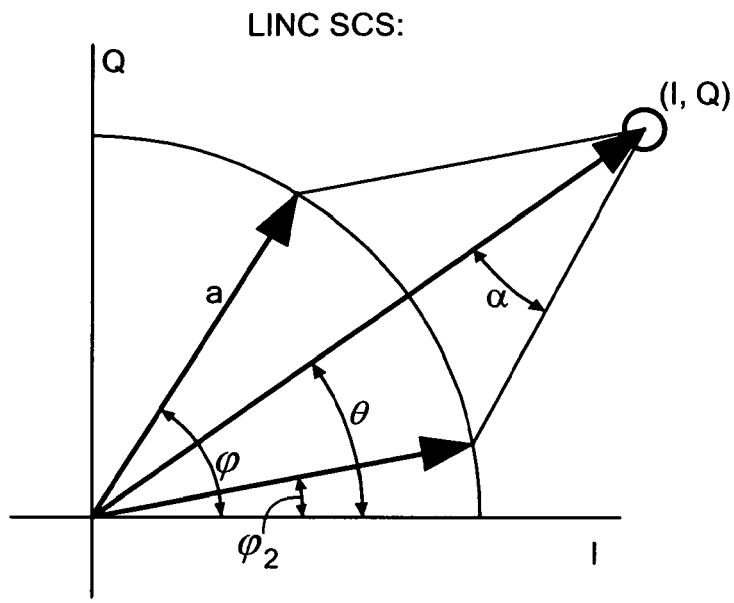
FIG. 1B is a phasor diagram showing a relationship among the phase voltages for a linear-amplification-by-nonlinear-component (LINC) outphasing architecture.
Figure 1C:
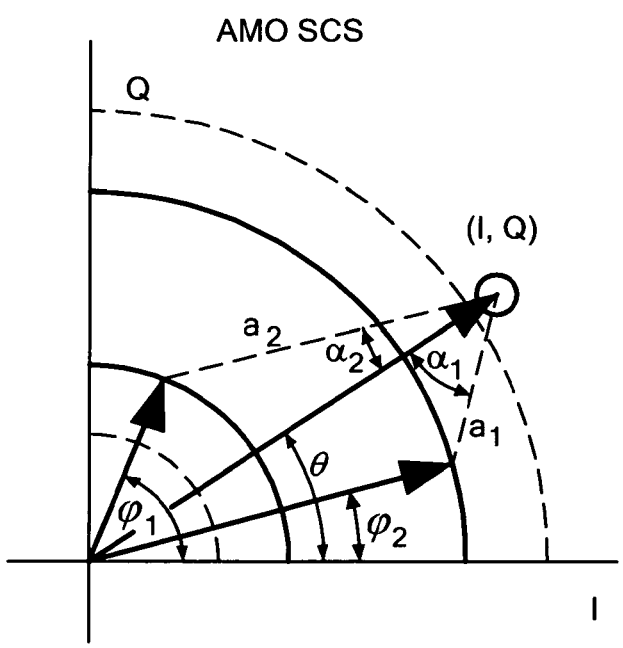
FIG. 1C is a is a phasor diagram (I-Q plot) showing a relationship among the phase voltages for an AMO SCS outphasing architecture such as that shown in FIG. 1A.

FIGS. 1B and 1C illustrate working schemes of LINC SCS and AMO SCS, respectively, for an arbitrary IQ sample (I,Q). As illustrated in FIGS. 1B, 1C, the SCS decomposes the signal (I,Q) to provide two signals having phases (or outphasing angles) denoted as ~1, φ2 and amplitudes denoted as a1, a2, where for LINC a1=a2=a. As noted above, the outphasing angles φ1 and φ2 for both LINC SCS and AMO SCS architectures are derived from the equations summarized in Table I.

TABLE 1

LINC and AMO SCS Equatioons.

| LINC Equations | AMO Equations |
|---|---|
| $A = \sqrt{I^2 + Q^2}$, $\theta = \arctan\left(\frac{Q}{I}\right)$ (linc1) | $A = \sqrt{I^2 + Q^2}$, $\theta = \arctan\left(\frac{Q}{I}\right)$ (amo1) |
| $\alpha = \arccos\left(\frac{A}{2a}\right)$ (linc2) | $\alpha_1 = \arccos\left(\frac{a_1^2 + A^2 - a_2^2}{2Aa_1}\right)$, |
|  | $\alpha_2 = \arccos\left(\frac{a_2^2 + A^2 - a_1^2}{2Aa_2}\right)$ (amo2) |
| $\phi_1 = \theta + \alpha$, $\phi_2 = \theta - \alpha$ (linc3) | $\phi_1 = \theta + \alpha_1$, $\phi_2 = \theta - \alpha_2$ (amo3) |
|  | $f(\varphi_1) = \frac{1}{1 + \tan(\varphi 1)}$, |
|  | $f(\varphi_2) = \frac{1}{1 + \tan(\varphi 2)}$ (amo4) |

In the AMO equations (shown in the right hand column of Table I), $a_1$, $a_2$ represent the power supplies of the two PAs respectively. The values of signals $a_1$, $a_2$ are restricted to the set of voltages $V=\{V_1, V_2, V_3, V_4\}$, where $V_1 \leq V_2 \leq V_3 \leq V_4$ correspond to the four levels of supply voltages provided by the multilevel supply in FIG. 1A. Equations in (amo4) of Table I are in the signal decomposition process simply due to the architecture requirement from the digital-to-RF-phase-converter (DRFPC), which converts the digital outputs to RF modulated signals and takes a function of the phase f(φ) as the input. Generally, computations in (amo4) depend upon the type of the modulator and may be different than that which is presented here.

Conventional low-throughput LINC SCS and recent AMO implementations typically involve the use of coordinate rotational digital computer (CORDIC) and a LUT map for the nonlinear functions shown in Table I. The maturity of the CORDIC algorithm and simplicity of the LUT approach make them suitable for LINC SCS applications having a throughput below 100 MSamples/s and with low to medium resolution (≤8 bits for example). However, the CORDIC and LUT approaches become less attractive or even prohibitive for use in those applications which require throughput in the multi-GSamples/s range with high phase resolution (≥10 bits for example) such as mm-wave wideband applications, for example.

To overcome this limitation of conventional signal component separators, and in accordance with one aspect of the present invention, it has been found that using fixed-point piece-wise-linear (PWL) approximations on nonlinear functions provides a balance between accuracy, power and area.

Thus, the motivation for a new approach to the nonlinear function computation is to avoid and replace complex computations with relatively simple and energy-efficient computations. For example, table look-up with LUTs of reasonable sizes, adders and multipliers are favorable computations to perform.

In the case of an SCS, it is realized that functions involved in SCS computations are smooth over almost an entire input range of interest. Hence, SCS computations are suitable to be approximated by functions with relatively simple structured basis functions, such as polynomials, splines and etc. Such considerations led to the recognition that a FP PWL function approximation of the nonlinear functions could be effectively used for an SCS.

Figure 2A:
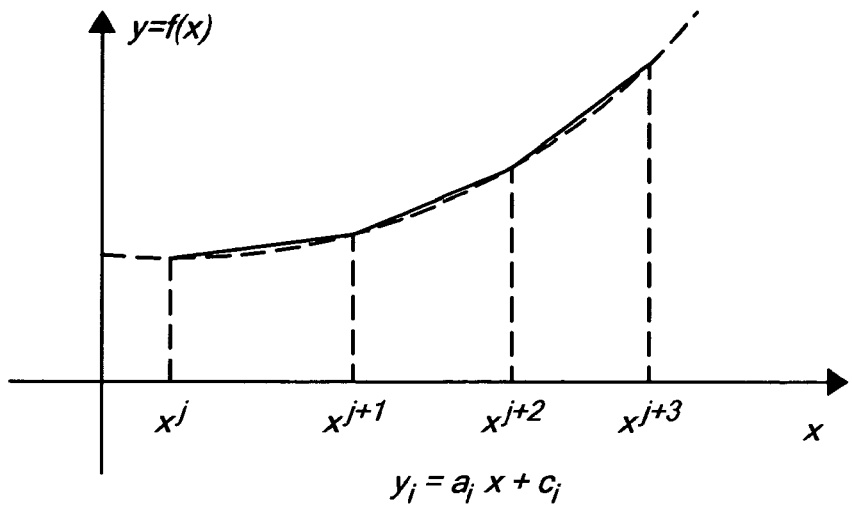
FIG. 2A is a plot which illustrates the general concept of piece wise linear (PWL) approximation.

Referring now to FIG. 2A a graph illustrates a general application of the PWL approximation to any smooth nonlinear function which is smooth over an input range of interest. An input x is divided into several intervals, where a linear function $y_i = a_i x + c_i$, $x \in [x_i, x_i+1)$ is constructed in each interval to approximate the actual function value in that range. With this approximation, the computation of the nonlinear function comprises a linear function computation in each interval (add and multiply), in addition to a relatively small LUT for the linear function parameters $a_i$, $c_i$ in each interval. In terms of accuracy, for any function which has a continuous second-order derivative, the approximation error is bounded by the interval length, the second-order derivative and does not depend upon higher-order derivatives. Thus the approximation error (denoted as |error|) may be expressed as shown in Equation (1):

$$|\text{error}| \leq \frac{1}{8}(x_{i+1} - x_i)^2 \max_{x_i \leq x \leq x_{i+1}} |y''(x)|. \quad (1)$$

in which:

$x_i$, $x_{i+1}$ are the boundaries of the $i^{th}$ interval; and y" is the second-order derivative in x.

It is observed that the approximation error can be made arbitrarily small with increases in the number of approximation intervals (or conversely can be made arbitrarily large with decreases in the number of approximation intervals). These initial examinations on the computational complexity and approximation accuracy of the piece-wise linear approximation make it an appealing alternative technique for circuit designs having nonlinear functions such as LINC and AMO SCS designs.

To benefit from the desired properties of the FP PWL approximation, it can be tailored to be hardware-implementation friendly. Significantly, all the arithmetic computations have to be converted to their fixed-point counterparts, and the question is whether the resulting fixed point computations are able to operate at multi-GSamples/s throughputs with high accuracy. In considering this question, the most seemingly obvious solution is a direct quantization of the parameters in the floating-point representation of the approximation formula.

It has however, been recognized in accordance with the concepts, systems and techniques described herein, that this may not be an optimal solution if throughput is the major concern and bottleneck. This is due, at least in part, to the fact that the operands $a_i$, $c_i$ of the add and multiply operations are quantized to have the same long bits as the output, and these long-bit arithmetic's are likely to be in the critical timing path. Thus, further optimization of the long multiplication would add complexity to the design.

With the above in mind, next described is a modified formulation of the fixed-point PWL approximation and a showing of the capability of running at a much higher throughput than the direct quantization version of the approximation.

The problem is to compute a nonlinear function of m-bit output with m-bit input $x \in [0, 1)$, using the PWL approximation. An m-bit input x can be decomposed to $x_1$ and $x_2$ as $$x = [\underbrace{x_1}_{m_1-MSBbit}, \underbrace{x_2}_{m_2-LSBbit}],$$

where $m=m_1+m_2$. Naturally, $x_1$ divides the input range to $2^{m_1}$ intervals and it is the indexing number of those intervals.

Figure 2B:
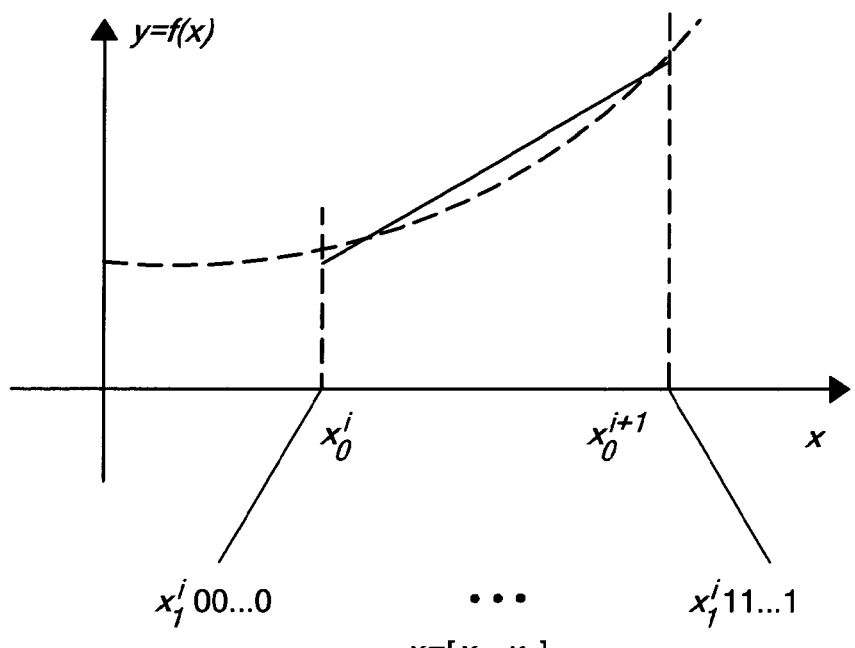
FIG. 2B is a plot which illustrates a fixed-point PWL approximation.

Referring now to FIG. 2B, an enlargement of the $i_{th}$ interval of the approximation is shown, where $x_1$ takes its $i^{th}$ value, and $x_2$ takes $2^{m_2}$ values, ranging from 0 to $2^{m_2}-1$. Under this setup, the proposed fixed-point scheme shown in Equation (2) is used.

$$y_i = \underbrace{b_i \cdot 1}_{m_1-MSBbit} + \underbrace{k_i(x_2 - S_i \cdot 1)}_{m_2-LSBbit}, i = 0, 1, \ldots 2^{m_1} - 1, \quad (2)$$

in which:

$$y_i = [y([i, 0]), y([i, 1]), \ldots, y([i, N_2 - 1])]^T$$

$$x_2 = \frac{1}{N}[0, 1, \ldots, N_2 - 1]^T$$

$$1 = [1, 1, \ldots, 1]^T \in \mathbb{R}^{N_2}$$

$$N_1 = 2^{m_1}$$

$$N_2 = 2^{m_2}$$

$$N = 2^m$$

$$m = m_1 + m_2$$

$k_i$, $S_i$, $b_i \in \mathbb{R}$ and they are all fixed-point numbers.

The underlying idea of this formulation is to compute the m-bit output part by part. In the linear function of each interval, the term $b_i$ represents the most significant $m_1$ bits of the function value, and the term $k_i(x_2 - S_i 1)$ is used to achieve the lower-significant $m_2$ bits of accuracy. The term $y_i$ is the concatenation of the two parts. The procedures to find the fixed-point representations of the three parameters $k_i$, $S_i$, $b_i$ in Equation (2) are next described in conjunction with FIG. 2C.

Figure 2C:
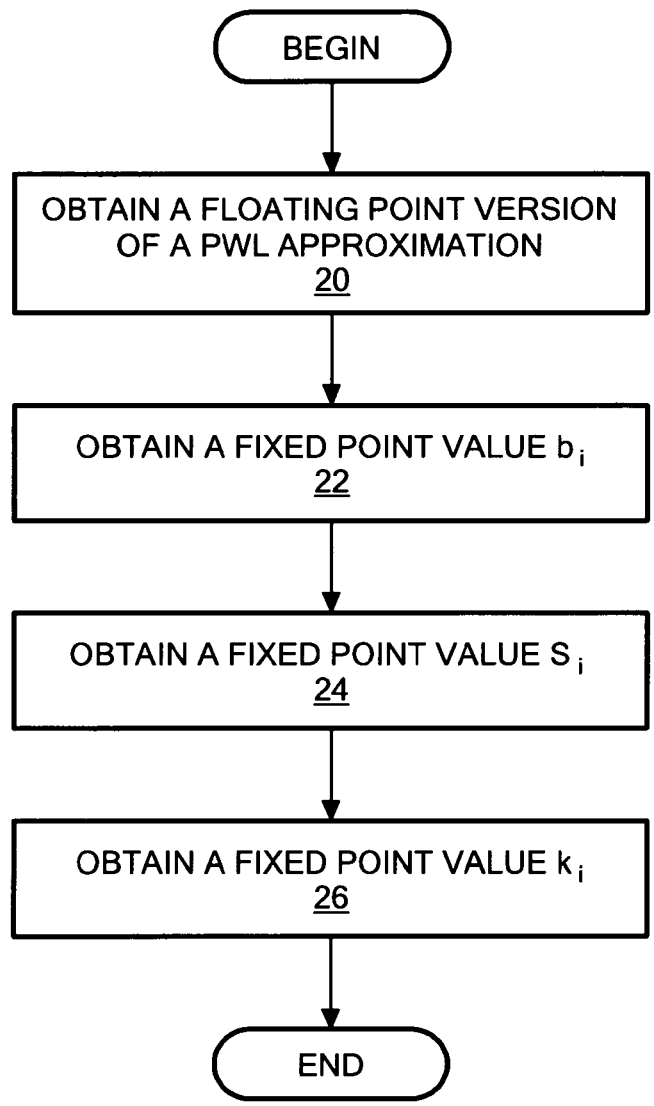
FIG. 2C is a flow diagram which illustrates a process for determining a fixed-point PWL approximation.

FIG. 2C is a flow diagram showing the processing performed by a processing apparatus which may, for example, be used to design a circuit implementing a nonlinear function such as an SCS (such as the AMO SCS shown in FIG. 1A) or as part of any other circuit or system in which is it necessary or desirable to implement nonlinear functions. The rectangular elements (e.g. block 20 in FIG. 2C) in the flow diagrams are herein denoted "processing blocks" and represent steps or instructions or groups of instructions. Some of the processing blocks can represent an empirical procedure or a database while others can represent computer software instructions or groups of instructions. Thus, some of the processes described in the flow diagram may be implemented via computer software while others may be implemented in a different manner e.g. via an empirical procedure.

Alternatively, some or all of the processing blocks can represent processes performed by functionally equivalent circuits such as a digital signal processor (DSP) circuit or an application specific integrated circuit (ASIC). The flow diagram does not depict the syntax of any particular programming language. Rather, the flow diagram illustrates the functional information one of ordinary skill in the art requires to perform the processes or to fabricate circuits or to generate computer software to perform the processing required of the particular apparatus. It should be noted that where computer software can be used, many routine program elements, such as initialization of loops and variables and the use of temporary variables are not shown. It will be appreciated by those of ordinary skill in the art that unless otherwise indicated herein, the particular sequence of processes described is illustrative only and can be varied without departing from the spirit of the broad concepts described herein.

Turning now to FIG. 2C, in processing block 20, the floating-point version of the PWL approximation is obtained. The optimal real coefficients of the linear function in each interval in terms of $l_2$ norm can be found by least-square optimization as shown in Equation (3), where the design variables are $k_i^r$ and $b_i^r \in \mathbb{R}$.

The superscripts denote that they are floating-point real numbers; x2 and yi are defined as in Equation (2).

$$\min_{k_i^r, b_i^r} \|y_i - (k_i^r \cdot x_2 + b_i^r \cdot 1)\|_2, \quad (3)$$

for $$i = 0, 1, 2, \ldots, N_1 - 1,$$

The approximation error bound in Equation (1) shows that the error is proportional to $(x_{i+1} - x_i)^2$, which in the fixed-point input case, equals $2^{-2m_1}$.

Letting $m_1 = \lceil m/2 \rceil$, then it is possible to realize the required output m-bit accuracy with only $2^{\lceil m/2 \rceil}$ intervals. Since the number of intervals determines the number of address bits of the LUT that stores the parameters of the linear function in each interval, this LUT ($2^{\lceil m/2 \rceil}$ entries) is considerably smaller than a direct map from input to output ($2^m$ entries). The following steps determine the fixed-point parameter values, i.e., the content of the LUT.

The following procedure determines the fixed-point parameter values, i.e., the content of the LUT.

As shown in processing block 22, a fixed point value $b_i$ is obtained. The fixed point value $b_i$ can be achieved simply by quantizing the $b_i^r$ to $m_1$-bit. As mentioned above, the m-bit output is constructed part by part with $b_i$ as the constant term in the $i^{th}$ interval, representing the major part of the function value in that interval. As long as the functional value increment in each interval is less than $2^{-m_1}$, that is, the functional derivative $|y'(x)|<1$, it is enough to use the $m_1$-MSB of $b_i$ to represent the $m_1$-MSB of the output.

As shown in processing block 24, a fixed point value $S_i$ is obtained. Since processing block 22 yields a $b_i$ having a maximum quantization error of $2^{-m_1}$, to compensate for the accuracy loss of $b_i^r-b_i$, an extra parameter $S_i^r$ is introduced such that $k_i^r S_i^r = b_i^r - b_i$. Its fixed-point counterpart $S_i$ is computed as in Equation (4)

$$S_i = \text{quantize}((b_i^r - b_i)/(k_i^r)). \quad (4)$$

The number of bits of $S_i$ is determined such that $k_i^r S_i$ has the accuracy of m+1 bits. Experience with the functions involved in the SCS design concepts described herein, it has been learned that $S_i$ usually has the number of bits around or a few more (i.e. 2-4) bits than m/2, depending on the derivative $k_i$ of the function in each interval.

Processing then proceeds to processing block 26 in which a fixed-point value $k_i$ is obtained. The slope of the function in the $i^{th}$ interval $k_i$ can also be obtained by simply quantizing its floating-point counterpart from the optimization procedure in processing block 20. As shown in Equation (2), the term $k_i(x_2 - S_i \cdot 1)$ contributes to the second part of the output—the $m_2$ LSBs. Since $x_2 - S_i$ has an accuracy of at least m bits, $k_i$ has to have at least $m_2$ bits to make the $m_2$ LSBs of the output.

The above procedure provides a technique to obtain the three fixed-point parameters of the linear function in each interval, but also provides benefit in the high-throughput hardware micro-architecture design.

Figure 3A:
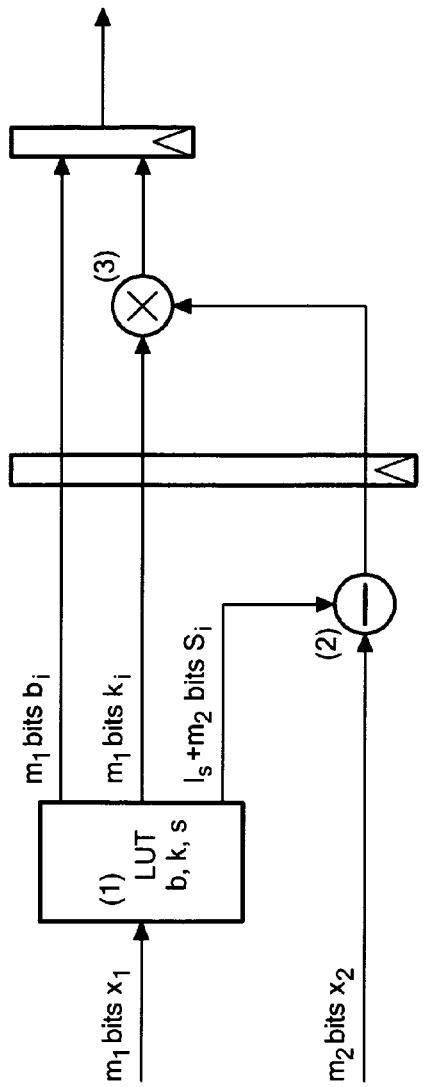
FIG. 3A is a block diagram of a micro-architecture of the FP PWL approximation.
Figure 3B:
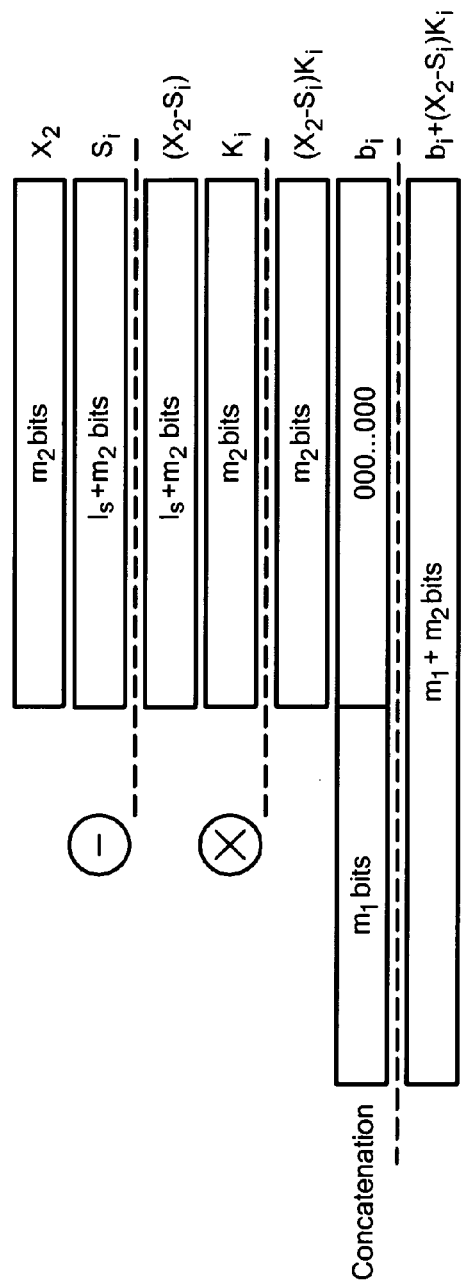
FIG. 3B is an illustration of the computations in the FP PWL approximation in the architecture illustrated in FIG. 3A.

Referring now to FIGS. 3A and 3B, a micro-architecture (FIG. 3A) of the approximation and the manner in which the computations are carried out (FIG. 3B) are shown. There are essentially three arithmetic operations involved: LUT, one adder, and one multiplier. The LUT takes the $m_1$ MSBs of the input as the address and outputs the parameters $b_i$, $k_i$, $S_i$ in the corresponding interval. Then the linear function computations follow accordingly.

From FIG. 3A, it can be seen that for all arithmetic computations, the operands have $m_1$, $m_2$ or $l_s+m_2$ bits, but not m bits as input. As discussed above, it is a good choice to set $m_1 = \lceil m/2 \rceil$, hence with operands of m/2 bits (roughly) in all computations, one is able to achieve the m-bit output.

This implies two important improvements in hardware efficiency: storage and throughput. For a direct LUT implemented function, if both the input and output have m bits, the storage required is $m \cdot 2^m$. With the proposed scheme, the storage is $(2m_2+l_s+m_1) \cdot 2^{m_1}$, which is approximately $1.5m \cdot 2^{m/2} \sim 2m \cdot 2^{m/2}$ assuming $m_1=m_2=m/2$ (when m is even) and $l_s$ small ($\leq 4$). Table II illustrates a comparison on the storage usage between the direct LUT map and the fixed-point PWL approximation approach for a range of m from 10 to 16 (which is considered to be a practical range).

TABLE II

Storage comparison examples between a direct LUT map approach and fixed-point piece-wise linear approximation approach

| m | Direct LUT size L1 (bits) | Approx. LUT size L2 (bits) | Improvement ratio (L1/L2) |
| --- | --- | --- | --- |
| 10 | $10 \times 2^{10}$ | $20 \times 2^5$ | $2^4$ |
| 12 | $12 \times 2^{12}$ | $24 \times 2^6$ | $2^5$ |
| 14 | $14 \times 2^{14}$ | $28 \times 2^7$ | $2^6$ |
| 16 | $16 \times 2^{16}$ | $32 \times 2^8$ | $2^7$ |

The last column of Table II shows the ratio of LUT size from approximation versus the one from direct LUT map, which reflects the storage savings of 10-100× for the range of values of Interest. The net area advantage of the FP PWL approximation approach described herein versus the direct LUT will depend upon the actual technology and throughput specifications, since these would dictate the type of the storage elements being used.

For example, in high-throughput applications, register-based LUTs are needed while in lower throughput conditions, SRAM-based LUTs can be used. Under both types of LUT implementations, the additional area consumption brought by one adder and one multiplier is almost negligible compared to the LUT area. For example, in 45 nm SOI technology, the direct LUT implementation of a 16-bit in/out arccos function consumes an area of 19 mm² in register-based implementation and 0.7 mm² SRAM implementation.

With the FP PWL approximation, area consumption reduces to 46200 µm² with register implementation and 9784 µm² with SRAM. The adder and multiplier consume roughly 1280 µm² in total, which is a relatively small size compared to the size of the overall area consumption. The FP PWL approximation approach thus results in a large advantage in storage size and the advantage becomes more prominent as the input and output sizes increase. As for the throughput, because of the short operands and LUT address, the whole chain of operations (e.g. LUT, add and multiply) can be pipelined into a few stages depending upon the process and throughput requirement. For example, with a 45 nm SOI process, two pipeline stages are used: table lookup and adder in the first pipeline stage and a multiply in the second pipeline stage. This structure can sustain roughly a 2-GSamples/s throughput to compute a 15-bit input and output nonlinear function.

It should be noted that an alternative way to express the formulation of Equation (2) is as shown below in Equation (5):

$$y_i = k_i \cdot x_2 + (-k_i S_i \cdot 1 + b_i \cdot 1) = k_i \cdot x_2 + c_i. \quad (5)$$

To compare the two formulations (i.e. the formulations of Equations (2) and (5), consider the following two aspects: storage size and arithmetic computation complexity. In terms of storage size, the formulation expressed by Equation (2) requires $(m_1+m_2+m_2+ls) \cdot 2_{m_1} = (2m_2+m_1+ls) \cdot 2_{m_1}$ bits while Equation (5) requires $(m_1+m_2+m_2) \cdot 2_{m_1} = (2m_2+m_1) \cdot 2_{m_1}$ bits. The formulation of Equation (2) does require an additional amount of storage corresponding to $ls \cdot 2_{m_1}$ bits, however, it brings the advantage of shorter operands of the add operation. In terms of arithmetic operation complexity, the formulation of Equation (2) requires an adder with $m_2+ls$ and $m_2$-bit operands, a multiplier with $m_2+ls$ and $m_2$-bit operands, while the formulation of Equation (5) requires an m-bit full adder and $m_2$-bit multiplier. As m gets large, the long adder required by Equation (5) may need further pipelining and complicates the design at high throughput. Furthermore, the optimization lets the term $b_i$ represent the first $m_1$ bits while it chooses $k_i$ and $S_i$ in Equation (2) so that $k_i(x_2-S_i)$ exactly represent the rest of the $m_2$ bits, to avoid any overflow and an additional adder. The design is more throughput rather than area-limited, therefore with the above considerations, the formulation expressed by Equation (2) is selected to achieve a higher throughput with more compact arithmetic hardware.

Next described is an example of computing a normalized 16-bit input, 16-bit output arccosine function $y=\arccos(x)/(2\pi)$ using the proposed FP PWL approximation approach. This function is one of the functions in an actual AMO SCS design.

First, a floating-point representation of the PWL approximation is obtained. This may be accomplished, for example, through the following least-square minimization) as expressed in Equation 6:

$$\min_x \|Ax - \beta\|_2, \text{ where} \quad (6)$$

$$A = \begin{bmatrix} 1, & 1, & \ldots, & 1 \\ \frac{0}{N^2}, & \frac{1}{N^2}, & \ldots, & \frac{N-1}{N^2} \end{bmatrix}_{N \times 2}^T,$$

$$x = \begin{bmatrix} b_0^r & b_1^r & \ldots & b_{N-1}^r \\ k_0^r & k_1^r & \ldots & k_{N-1}^r \end{bmatrix}_{2 \times N},$$

$$\beta = \begin{bmatrix} y_{0,0} & \ldots & y_{N-1,0} \\ y_{0,1} & \ldots & y_{N-1,1} \\ \vdots & \ddots & \vdots \\ y_{0,N-1} & \ldots & y_{N-1,N-1} \end{bmatrix}_{N \times N}.$$

In which

N=8, half of the number of input bits;

$y_{i,j}=y([i,j])=\arccos((2^N i+j)/2^{2N})/(2\pi)$, i,j=0, 1, ... N-1; and i acts as the address for the LUT.

The optimal floating-point parameters $b^r$, $k^r$ yield a maximum absolute error $<2^{-16}$ for the input range $x \in [0, 0.963]$.

For input $x \in (0.963, 1]$, the PWL approximation does not behave as well because of the large derivative value when the input approaches 1. However, this case occurs when the input sample vector nearly aligns with the two decomposed vectors, namely A is approaching $a_1+a_2$ and $\alpha_1, \alpha_2 \to 0$. One solution is to redefine the threshold values such that those samples use a set of higher level of power supplies so as to avoid the situations of $\alpha_1, \alpha_2 \to 0$.

Then, the terms $b^r$ and $k^r$ are quantized to eight bits, and Equation (4) is used to obtain the offset S. It turns out that the offset parameter uses eleven bits. The resulting accuracy after all the quantization is $<2^{-15}$ in terms of maximum absolute error.

Table III shows the place and route results of the hardware implementation with the proposed approximation approach, as well as other approaches as comparisons.

TABLE III

Comparison between PWL, CORDIC implementations of the 16-bit input, output function $y(x) = \cos^{-1}(x)$.

| | Minimal clock period (ps) | Power consumption (mW) (post-extraction simulation) | Area (μm × μm), Density (%) | Energy per operation (pJ/op) |
|---|---|---|---|---|
| Proposed PWL (hardwired LUT) | 792 | 3.24 (at 1 GHz) | 80 × 60, 80% | 3.24 |
| Proposed PWL (programmable LUT) | 856 | 7.23 (at 1 GHz) | 250 × 240, 77.5% | 7.23 |
| Unrolled radix-4 CORDIC | 2600 | 63.1 (at 400 MHz) | 220 × 200, 81.4% | 157.75 |
| 6th order polynomial | 250 | 42 (at 1 GHz) | 200 × 200, 70% | 42 |

It should be noted that Table III shows two versions of the approximation approach with each version having a different way of handling the LUT: one version has the LUT programmable and the other version has it hardwired.

The conventional approaches shown in Table III as comparisons include CORDIC and a sixth order polynomial approximation. CORDIC is a general iterative approach to implement the trigonometric functions. However, due to its general purpose, it is much less energy-efficient and with lower throughput compared to the FP PWL approximation described herein. The polynomial approximation, as another alternative to approximate the nonlinear functions, requires more multipliers than the FP PWL approximation described herein, and hence is also less energy-efficient than the FP PWL approximation approach. As a summary, the proposed FP PWL approximation approach provides 6-20 times improvement in energy-efficiency as well as significant area savings compared with conventional approaches.

The design of an exemplary integrated circuit using the FP PWL approximation approach is next described. In this exemplary design, a baseband system uses a 64-QAM modulation scheme and has a target symbol throughput of 1-2 GSym/s. The system has an oversampling rate of 4 or 2, resulting in a system sample throughput of 4 GSam/s. The baseband needs to provide at least −60 dB adjacent channel power ratio (ACPR). In order to meet this specification while overcoming a nonlinearity of a phase modulator digital to analog converter (DAC), the baseband is designed to achieve −65 dB ACPR with 12-bit phase quantization.

Figure 4A:
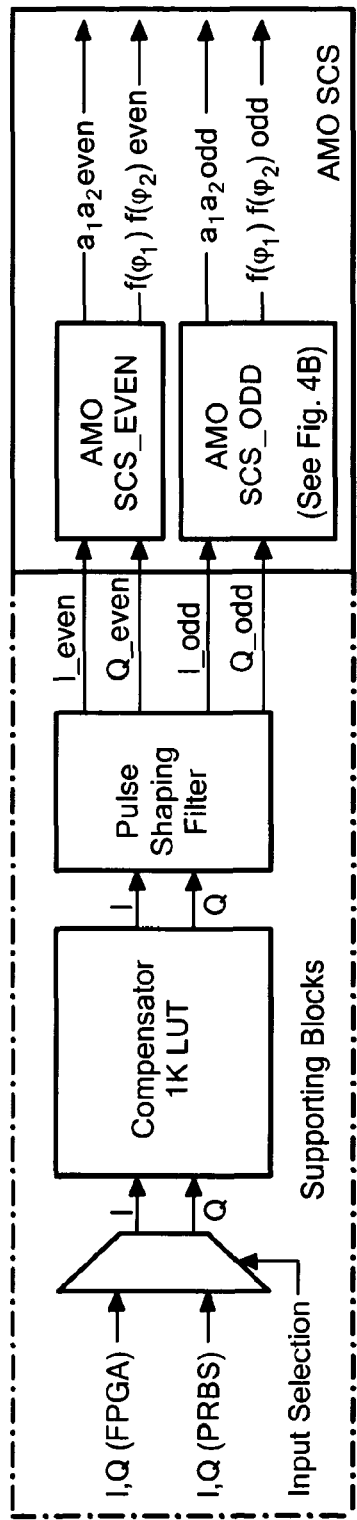
FIG. 4A is a block diagram of an AMO SCS implemented as an integrated circuit.

Referring now to FIG. 4A, a baseband system includes supporting blocks and an AMO SCS. The supporting blocks upsample and pulse-shape an input symbol sequence from a 64-QAM constellation to appropriate sample sequences, which are then fed to the AMO SCS.

As shown in FIG. 4A, the 3-bit I and Q symbols first pass through a LUT-based nonlinear predistorter with a size of $(2_{10}) \times 24$ and produce I/Q symbols with 12-bit accuracy in each dimension.

It should be understood that the system is not designed to have a powerful nonlinear predistorter, so this simple predistortion table is added for preliminary symbol space predistortion. The table size is chosen such that the predistorter has some memory while fitting in a desired die area. Then the 12-bit I and Q symbols pass through a pulse shaping filter which oversamples the symbols and produces 12-bit I and Q samples with shaped spectrum. Interleaving is explored here to achieve even higher throughput. The shaping filter produces one sample at the positive edge of a clock pulse and another at the negative edge. Therefore, two copies of the AMO SCS blocks follow the even and odd outputs of the filter.

Figure 4B:
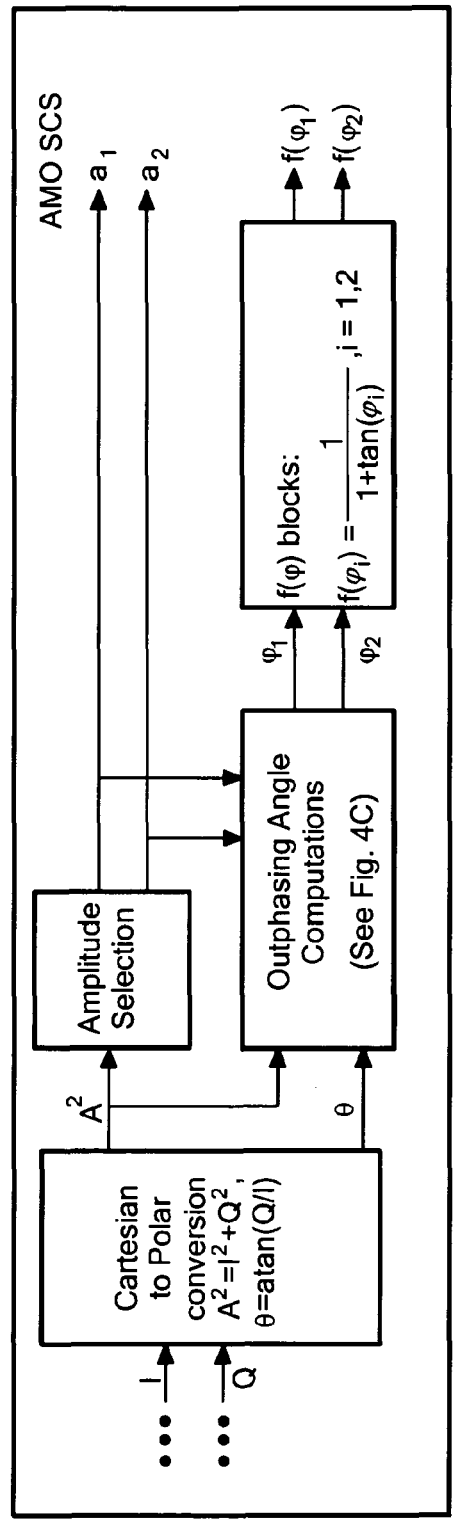
FIG. 4B is a block diagram of a portion of the AMO SCS shown in FIG. 4A.

Referring now to FIG. 4B, the AMO SCS includes a Cartesian-to-polar processor circuit, an amplitude-selection processor or circuit (such processors and/or circuits collectively referred to herein as a "processing element" or processing block, an outphasing-angle-computation processing element, and an angle function f(φ) processing element. The Cartesian-to-polar processing element computes the amplitude square and the angle of the I/Q samples in polar coordinates, corresponding to equation (amo1) in Table I.

The amplitude-selection circuit then takes the value of amplitude square and selects the pair of power supplies for the PAs (not shown in FIGS. 4A, 4B) in the two paths. Recall that the initial motivation to modify the LINC architecture to the AMO architecture is to introduce more supply levels to reduce (or in some cases, even minimize) combiner loss especially when the outphasing angle is large. Therefore, the choice of the power supplies directly affects the average power efficiency. According to the Wilkinson combiner's efficiency at sample amplitude A and two PA's supply voltages $a_i$, $a_j$ $$\eta_c(A, a_i, a_j) = \left(\frac{A}{\frac{(a_i + a_j)}{2}}\right)^2 \left(\frac{2\left(\frac{a_i + a_j}{2}\right)^2}{a_i^2 + a_j^2}\right), \quad (7)$$

the criterion shown in Table 3 is designed to select the pair of power supplies, where $$[th_1, th_2, \ldots, th_7] = [(2V_1)^2, (V_1 + V_2)^2, \quad (8)$$
$$(2V_2)^2, (V_2 + V_3)^2, (2V_3)^2, (V_3 + V_4)^2, (2V_4)^2],$$

and $V_1 \leq V_2 \leq V_3 \leq V_4$ are the four available power supply levels.

TABLE IV

Criterion for power supply pair selection. ($A^2 = I^2 + Q^2$)

| $a_1$, $a_2$ | Criterion |
| --- | --- |
| $V_1, V_1$ | $A^2 \leq th_1$ |
| $V_1, V_2$ | $th_1 < A^2 \leq th_2$ |
| $V_2, V_2$ | $th_2 < A^2 \leq th_3$ |
| $V_2, V_3$ | $th_3 < A^2 \leq th_4$ |
| $V_3, V_3$ | $th_4 < A^2 \leq th_5$ |
| $V_3, V_4$ | $th_5 < A^2 \leq th_6$ |
| $V_4, V_4$ | $th_6 < A^2 \leq th_7$ |

The criterion of Table IV are selected (or designed) to increase (or in some cases, even maximize) the combiner's efficiency, as expressed in Equation (7), by using the smallest pair of power supplies while still maintaining power levels large enough to form the transmitted sample. Obviously, there are more than the seven levels used here that can be designed from four supply levels. One significant factor that motivates the choice of the seven levels is the consideration of reducing (or ideally minimizing) the number of switching events with each power supply. Power supply switching is accompanied by ringing and slewing, which introduces nonlinear behavior and memory effects into the system and thus cause spectrum outgrowth and degradation in the linearity performance of the overall transmitter. The rules in Equation (8) make one adjacent power supply change when the sample amplitude jumps from one region to an adjacent region. This is what happens most of the time because the pulse-shaping filter smoothes the I/Q symbol transitions and limits the jumps between I/Q samples.

Figure 4C:
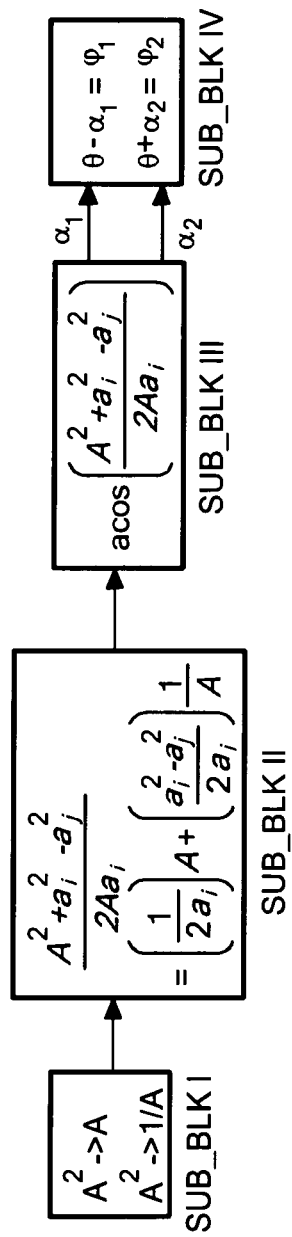
FIG. 4C is a block diagram of a portion of the AMO SCS shown in FIG. 4A.

The Outphasing-angle-computation processing element computes the two angles between the decomposed and transmitted vectors, corresponding to equations (amo2) and (amo3) in Table I. The steps of the computations are represented as four processing elements in FIG. 4C. The first two circuits compute the argument of the arccosine function ($A^2 + \alpha_i^2 - \alpha_j^2)/(2Aa_i)$, including square-root, inverse of square-root and summation operations. The terms $\frac{1}{2}a_i$ and $(\alpha_i^2 - \alpha_j^2)/(2a_i)$ in the second circuit correspond to two programmable constants which are selected after the determination of two supply levels. The third circuit computes the arccosine function and the fourth circuit computes the final outphasing angles.

The last processing circuit of f(φ) computation prepares the input signals for the phase modulator, which takes the form of 1=(1+tan(φ)). The LUT used in this processing circuit can also be programmed to compensate the static nonlinearity of the phase modulator DAC.

As a summary, Table V lists the arithmetic operations for each functional circuit shown in FIG. 4A.

TABLE V

Summary of arithmetic operations in each functional block of the AMO SCS.

| Functional block | | Arithmetic operations |
| --- | --- | --- |
| Cartesian-to-polar | | multiply, division arctan |
| Amplitude selection | | Comparator |
| Outphasing angles | SUB_BLK I | square-root, inversion of square-root |
| | SUB_BLK II | multiply, add |
| | SUB_BLK III | arccos |
| | SUB_BLK IV | add |
| f(φ) block | | $\frac{1}{1 + \tan(\varphi)}$ |

Next described are details of the micro-architecture of each block in the SCS system.

Figure 5:
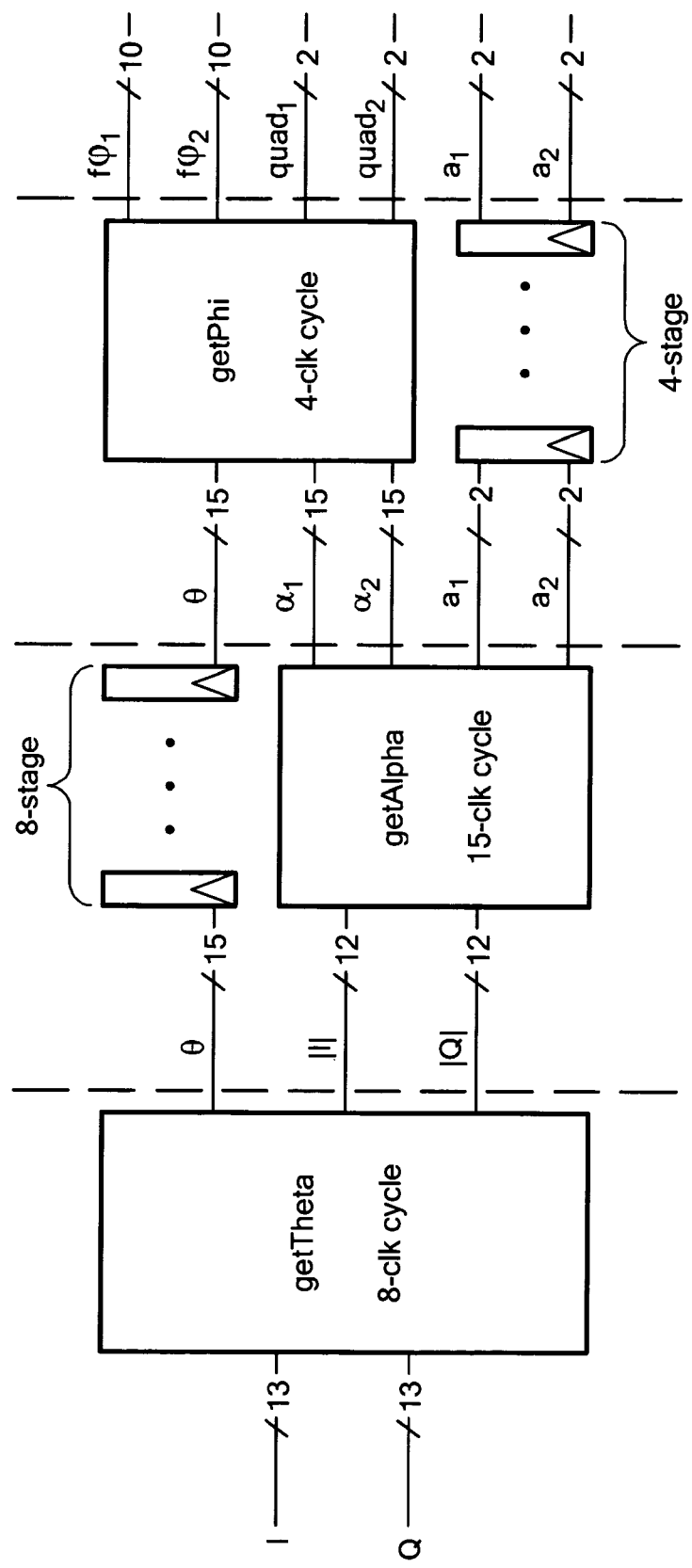
FIG. 5 is a block diagram of an SCS system.

Referring now to FIG. 5, an overall pipelined hardware block diagram is shown. It is roughly a direct translation from the conceptual block diagram in FIGS. 4A-4C. The I/Q samples generated by the shaping filter first pass through a getTheta processing element and produce the θ and |I|, |Q|. The following getAlpha processing element then takes |I| and |Q|, selects the two power supplies and computes the angles $\alpha_1$ and $\alpha_2$. This roughly corresponds to the Amplitude-selection and Outphasing-angle-computation processing elements in FIG. 4A. The angles $\alpha_1$ and $\alpha_2$, together with θ, are inputs to a getPhi processing element, which computes the function 1=(1+tan(φ)) on the outphasing angles $\phi_1$, $\phi_2$. This represents the f(φ) processing circuit in FIG. 4B. The final outputs provided by the SCS system are f$\phi_1$, f$\phi_2$, quad$_1$, quad$_2$, and $a_1$, $a_2$. Here, quad$_1$ and quad$_2$ are quadrant indicators of $\phi_1$ and $\phi_2$, respectively; f$\phi_1$, f$\phi_2$ are computed with $\phi_1$, $\phi_2$ converted to the first quadrant; $a_1$ and $a_2$ are the digital codes that control the PA power supply switches.

Next described is the manner in which each of the processing circuits accomplishes its tasks.

Figure 6A:
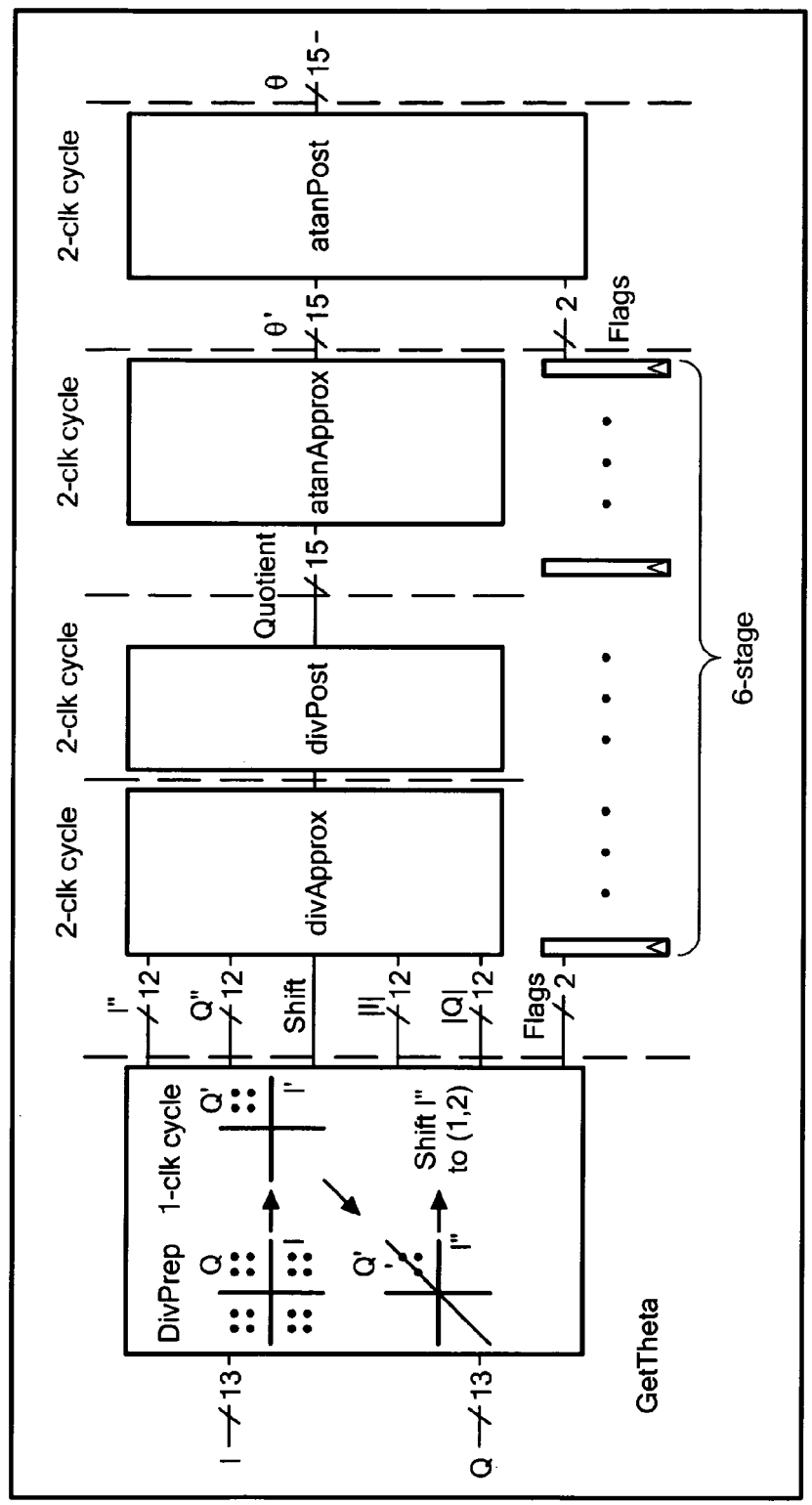
FIG. 6A is a block diagram of a getTheta processing element of the type shown in FIG. 5.

Referring now to FIG. 6A the micro-architecture of the getTheta processing circuit, illustrates two main operations as division and arctan. With the FP PWL approximation algorithm discussed above in conjunction with FIGS. 4A-4C, both functions can be realized with the micro-architecture described above in conjunction with FIG. 3. Before applying the approximation, it is important to carefully examine the input and output range of the function, because of the nature of the fixed-point computation. In order to have a good accuracy with the approximation, it is desirable to have an input range where the function behaves smoothly and has a nicely bounded derivative. Consider, as an example, the division function. The division function Q/I has two input variables, while the FP PWL approximation approach described herein assumes a single variable function. Thus, the computation of Q/I is divided into 1/I, followed by Q×(1/I). The inversion function 1/I has a discontinuity at I=0 and its derivative $-1/I_2$ becomes large as |I| approaches zero. In order to use the FP PWL approximation with good accuracy, several preprocessing steps are necessary to massage the input before doing the approximation of the inversion function 1/I.

Next described are treatments on the input, corresponding to the functions performed, for example, by the divPrep processing element in FIG. 6A:

Step (1): (I, Q) are first transformed to the first quadrant as (I', Q') where I'=|I| and Q'=|Q|. Use a flag of two bits to indicate whether the current sample (I, Q) is actually negative or not.

Step (2): Swap I' and Q' if Q'>I', so the resulting (I", Q") satisfies Q"=I"ϵ(0;1). The boundary values of 0 and 1 are computed as special cases separately. Again, use a flag to indicate whether the swap is performed on the current sample.

Step (3): Shift the input I" such that I"ϵ(1;2). The shift operation is always valid because the shaping filter coefficients are programmable and can be designed such that I, Qϵ[0,1]. This step just means shifting the bits in I" to the left until the MSB is 1. Record the shifted number of bits for each sample I".

It is clear that after the transformations, Q"/I" is different from the desired output Q/I, however these preprocessing steps can be compensated. Specifically, the swap in Step (2) and the absolute operation in Step (1) are taken care of after the computation of θ; and the shift operation in Step (3) are taken care of after the computation of Q"×(1=I").

Step (1): Shift back accordingly after the computation of Q"×(1=I"). This is an operation included in the divPost processing circuit, together with the multiplication Q"×(1=I").

Step (2): After the computation of θ', for values whose flag indicating a swap operation has happened, θ=π/2−θ', otherwise θ=θ'. This is included in the atanPost processing element in FIG. 6A.

Step (3): After Step (2), it is necessary to check further if a quadrant change has occurred to the current sample, and adjust the θ accordingly. This function may also be performed by the atanPost processing element.

With properly designed preprocessing, the input of inversion function 1/x takes the range of (1, 2), and the input of function arctan(x) takes the range of (0, 1). In these ranges, the functions have nicely bounded derivatives, enabling them to be suitable for the fixed-point PWL approximation. The two function's approximation computations are represented by processing elements divApprox and atanApprox in FIG. 6A, whose micro-architecture follows that shown in FIG. 3A. The overall getTheta processing element is able to achieve a throughput of 2 GSamples/s in the place and route timing analysis. The look-up tables that store the b, S, and k for the two functions have sizes as summarized in the first two rows of Table VI. Table VI also gives a size comparison to the LUTs which are used directly to map the nonlinear functions. Thus, inspection of Table VI reveals that orders of magnitude of LUT size can be saved by using the fixed-point PWL approximation approach described herein. The accuracy column also shows that an output accuracy of 14 bit is achieved.

TABLE VI

Summary of accuracy and LUT size of the PWL approximated function blocks

|  | max \|error\| | PWL LUT size | Direct LUT size | Improvement ratio |
|---|---|---|---|---|
| 1/x | 7e-5 | 30 × $2^7$ | 15 × $2^{12}$ | 4 |
| arctan(x) | 6e-5 | 25 × $2^7$ | 15 × $2^{15}$ | 128 |
| $\sqrt{x}$ | 2.3e-5 | 30 × $2^7$ | 12 × $2^{19}$ | 1638 |
| 1/$\sqrt{x}$ | 8.2e-5 | 30 × $2^7$ | 12 × $2^{19}$ | 1638 |
| arcos(x) | 2.4e-5 | 30 × $2^7$ | 15 × $2^{15}$ | 128 |
| 1/(1 + tan(x)) | 1.6e-5 | 26 × $2^7$ | 10 × $2^{15}$ | 100 |

Figure 7:
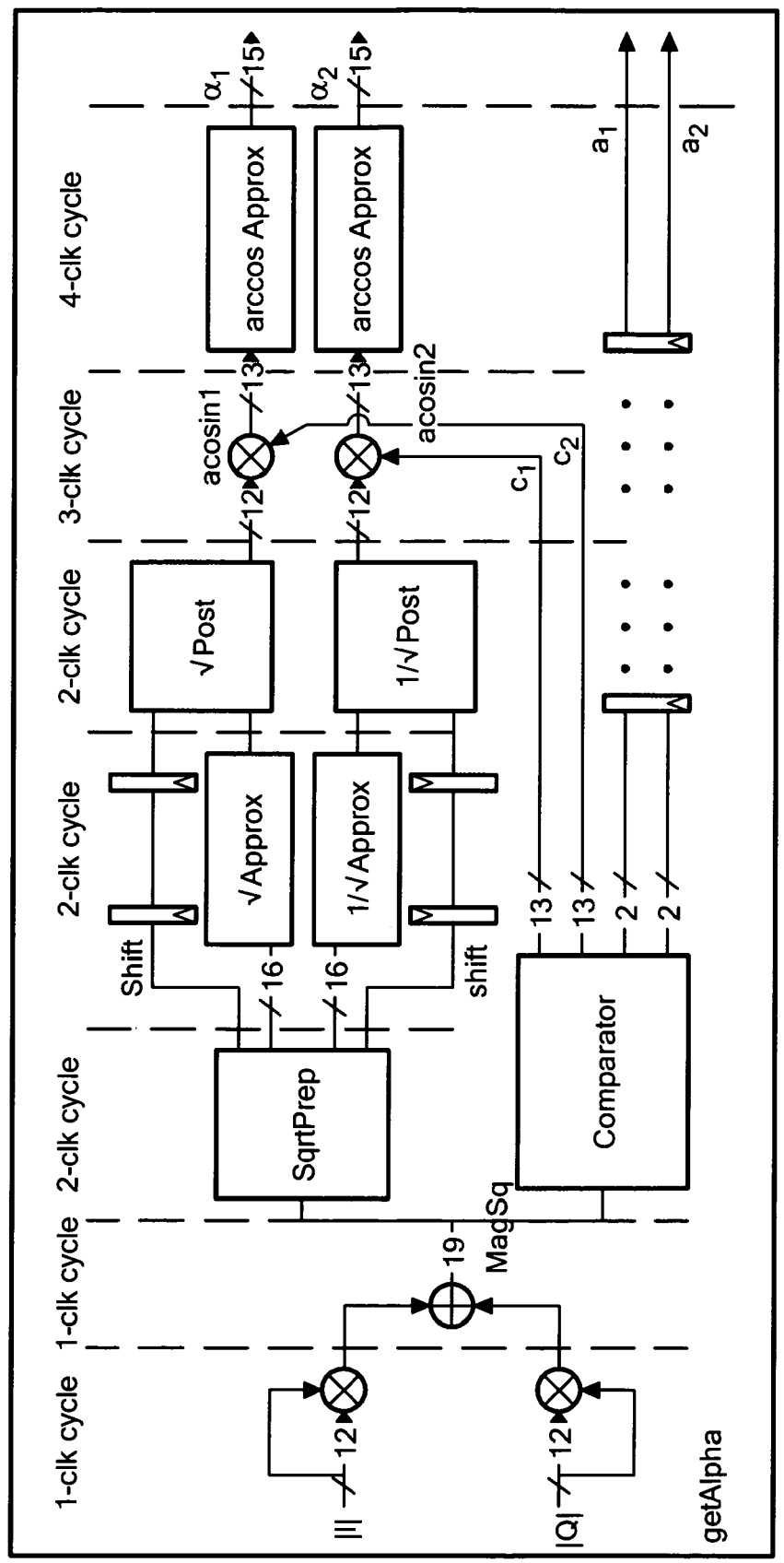
FIG. 7 is a block diagram of a getAlpha processing element of the type shown in FIG. 5.

Referring now to FIG. 7, a block diagram of an exemplary getAlpha processing element which may be the same as or similar to the getAlpha processing element of FIG. 5, illustrates that the $\alpha_1$ and $\alpha_2$ computations include two parts: obtain the argument to the arccos function and calculate the arccos function itself. In order to obtain the argument $(A^2 + a_i^2 - a_j^2)/(2A\alpha_i)$, the terms can be re-arranged as expressed in Equation 9.

$$\frac{a_i^2 + A^2 - a_j^2}{2Aa_i} = c_1 A + c_2 \frac{1}{A}, \qquad (9)$$

$$= \frac{a_i^2 - a_j^2}{2a_i},$$

and $$c_1 = \frac{1}{2a_i}, c_2$$

In which $c_1$ and $c_2$ are constants which are programmable values and are selected according to the selection of power supplies.

One problem with using the original formula $(a_i^2 + A^2 - a_j^2)/(2A\alpha_i)$ is the long-bit division, whose inputs are on the same order of $A^2$. On the other hand, Equation (9) involves no computations with inputs on the order of $A^2$.

The computations to obtain the terms A, 1/A in Equation (9) include approximations of the functions $\sqrt{x}$ and 1/$\sqrt{x}$, having inputs corresponding to the sum of $|I|^2$ and $|Q^2|$. Similarly, as discussed for the division computation, certain input preprocessing is necessary to avoid encountering large derivatives near a discontinuity point at 0. The SqrtPrep processing element of FIG. 7 serves this purpose by scaling the input to the range of [1=4,1), namely shifting two bits at a time either to the left or right until the input fits to the range. Then the approximations to the two functions are performed and followed by the post-processing parts that compensate for the shifting operations done to the inputs. With two more multipliers and one adder, the computations of Equation (9) are now accomplished. Then the function arcoos(x) takes the input arguments and provides angles $\alpha_1$, $\alpha_2$, as shown in the previous example. The LUT sizes and accuracy for the three functions are summarized in Table VI.

Figure 6B:
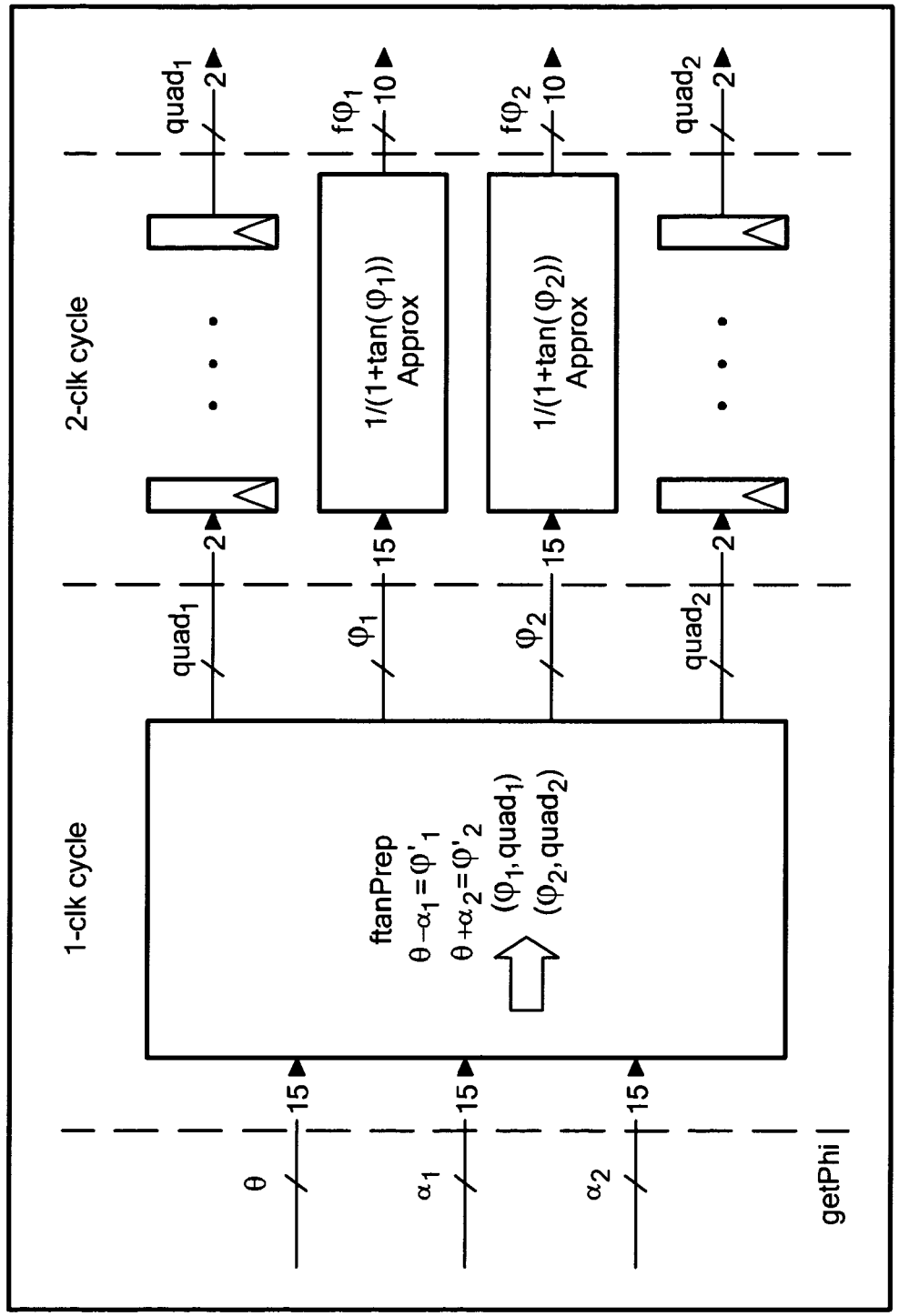
FIG. 6B is a block diagram of a getPhi processing element of the type shown in FIG. 5.

Referring now to FIG. 6B and as the final block in FIG. 5, the getPhi processing element takes the outputs $\alpha_1$, $\alpha_2$ and θ from the previous getAlpha and getTheta processing elements and produces the final outphasing angles f$\phi_1$ and f$\phi_2$. ThgetPhi processing elements first computes the outphasing angles $\phi_1$, $\phi_2$ in processing element ftanPrep, then the processing element which performs the function $1=(1+\tan(\phi))$ computes the final outputs. Nominally, the digital baseband SCS's tasks end after the ftanPrep processing element, delivering the outphasing angles themselves. However, there may be additional signal processing task at the interface between the digital baseband and the DRFPC phase modulator. In the case described, the phase modulator intended for use requires such a function on the outphasing angle as input.

Figure 11A:
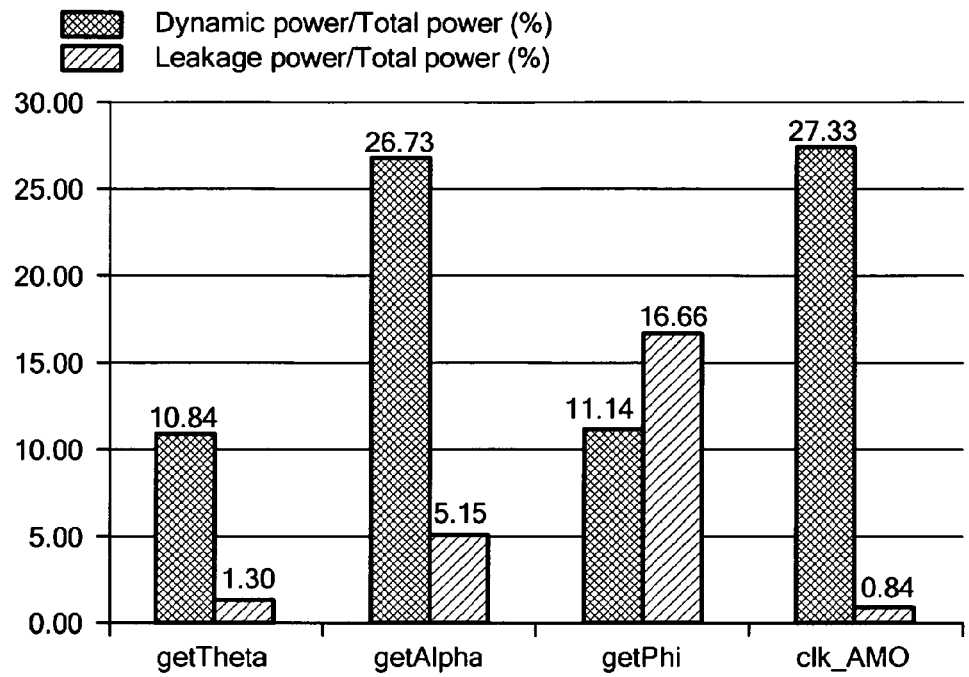
FIG. 11A is a plot of power breakdown of the AMO SCS of FIG. 10.

After obtaining the outphasing angles as $\phi_1=\theta-\alpha_1$ and $\phi_2=\theta+\alpha_2$, they are converted to the first quadrants and flags $quad_1$ and $quad_2$ (here illustrates as 2-bit flags) are used to indicate the quadrants. This conversion is necessary both for the sake of the phase modulator input requirement, as well as acting as a preprocessing step for the following functional approximation. By limiting the input to the first quadrant, the Referring now to FIG. 11A, a power breakdown of the AMO SCS is illustrated. Based upon the reported post-place and route power estimation values, the estimated contribution to the total AMO SCS power at 2 GHz operation is shown. The large proportion of the clocking power is in part due to the latency-matching register stages on amplitude paths required to compensate for the depth of the phase computations, and the leakage power of the getPhi processing element is due to its programmable LUT of the $f(\phi)$ function.

Figure 11B:
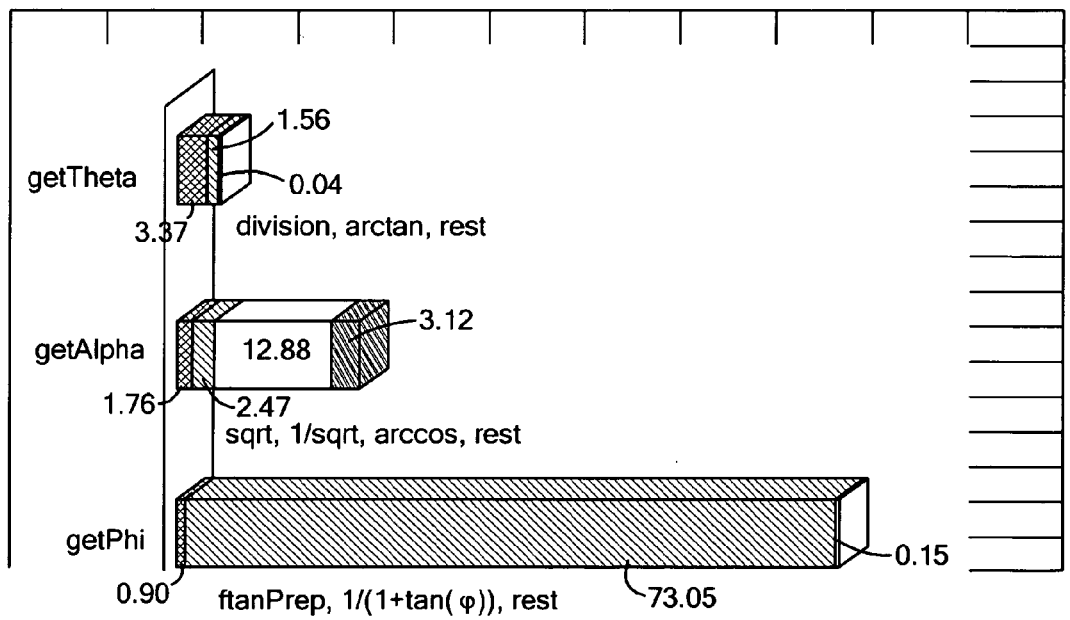
FIG. 11B is a plot of area breakdown of the AMO SCS of FIG. 10.

FIG. 11B, illustrates the area breakdown of the AMO SCS and shows the areas of major functional processing elements of the three main functions of the SCS. The computation of the function of $f(\phi)$ takes over two thirds of the area due to its programmable LUTs.

A comparison of the techniques described herein with other digital/analog implementations of LINC/AMO SCS is summarized in the first 5 columns of the Table VII.

TABLE VII

Comparison with other works.

|  | This work | [13] | [23] | [19] | [15] | [15] | [15] | [15] |
|---|---|---|---|---|---|---|---|---|
| Analog/Digital | Digital | Analog | Analog | Digital | Digital | Digital | Digital | Digital |
| Functionality | AMO | LINC | LINC | LINC | AMO | AMO | AMO | AMO |
| Technology | 45 nm SOI CMOS | 0.25 μm CMOS | 0.35 μm CMOS | 90 nm CMOS | 90 nm CMOS | 90 nm CMOS | Scaled to 45 nm CMOS | Scaled to 45 nm CMOS |
| Throughput | 3.4 GSam/s, 0.8 GSam/s | 20MSam/s | 1.5MSam/s | 50MSam/s | 40MSam/s | 40MSam/s | 40MSam/s | Scaled to 0.8 GSam/s |
| Phase Resolution | 12-bit | N/A | N/A | 8-bit | 8-bit | Scaled to 12-bit | Scaled to 12-bit | Scaled to 12-bit |
| Power | 323 mW, 46 mW | 45 mW | 80 mW | 0.95 mW | 0.36 mW | 8.64 mW | 4.32 mW | 86.4 mW |
| Energy/Sample | 95 pJ/Sam, 58 pJ/Sam | 2250 pJ/Sam | 5333 pJ/Sam | 19 pJ/Sam | 8.9 pJ/Sam | 212 pJ/Sam | 106 pJ/Sam | 106 pJ/Sam |
| Area | 1.5 mm$^2$ | 0.1 mm$^2$ | 0.61 mm$^2$ | 0.06 mm$^2$ | 0.34 mm$^2$ | 8.16 mm$^2$ | 2.04 mm$^2$ | 40.8 mm$^2$ | function $1/(1+\tan(\phi))$ has nicely bounded derivative as $-1/(1+\sin(2\phi))$ in the range of $[0,\pi/2]$. Otherwise, the function has a discontinuity at $3\pi/4$. So it is suitable to apply the FP PWL approximation on this function as well. The hardware cost in terms of the LUT size is again summarized in Table VI.

Figure 8A:
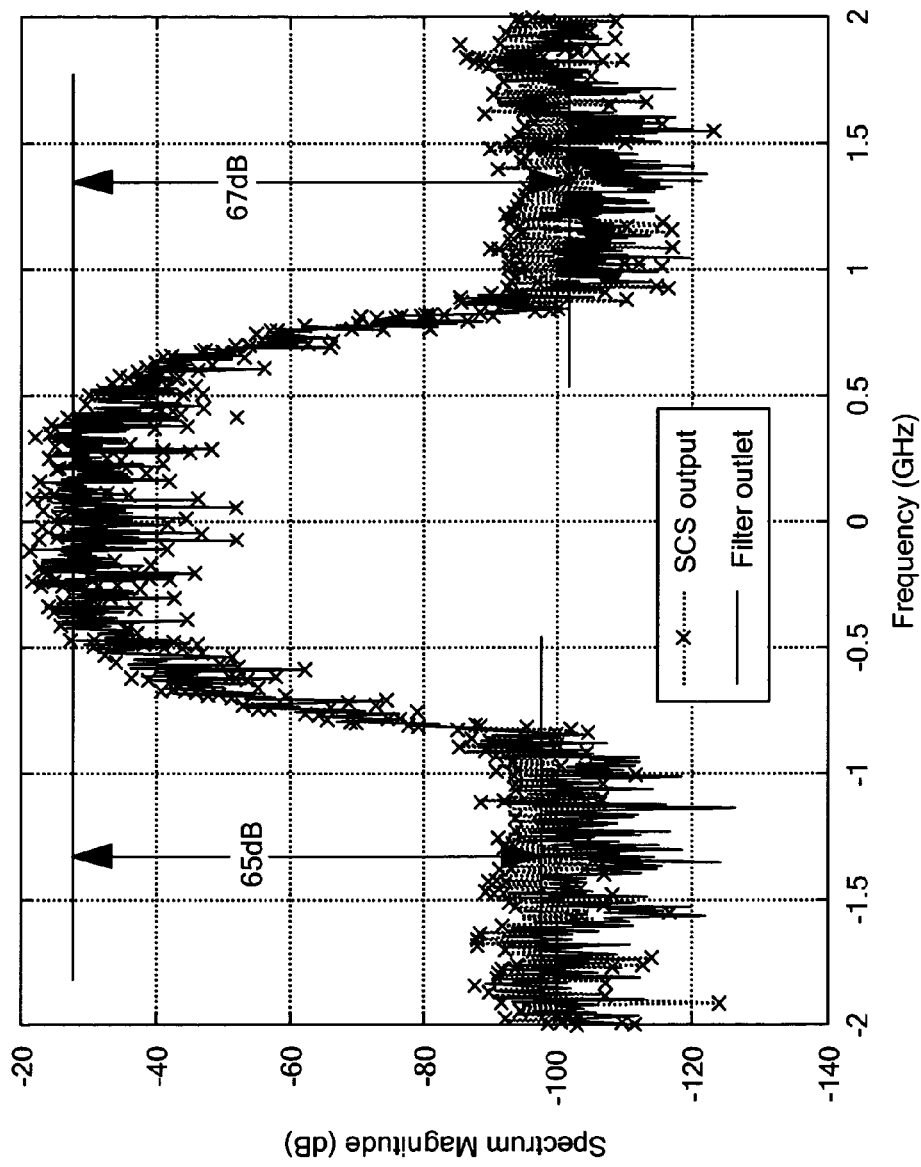
FIG. 8A is a plot of a frequency spectrum of an SCS output.
Figure 8B:
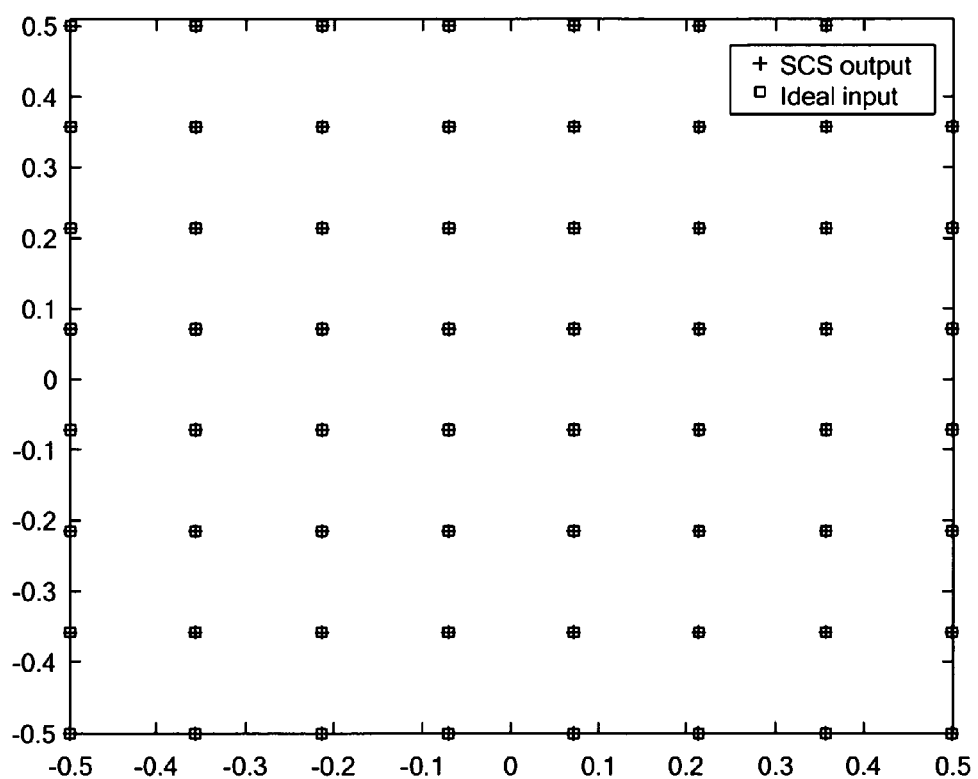
FIG. 8B is a plot which illustrates an EVM comparison of an SCS output and an ideal output.

With all nonlinear functions properly approximated and parameters quantized, the tested SCS output produces the signal spectrum as shown in FIG. 8A. Compared with the spectrum at the shaping filter's output, the SCS block reduces the ACPR by 2 dB, from 67 dB to 65 dB, due to the approximation and quantization errors. FIG. 8B shows the 64QAM constellation diagram between SCS output and ideal input, illustrating that the SCS introduces EVM of 0:08%.

Figure 9:
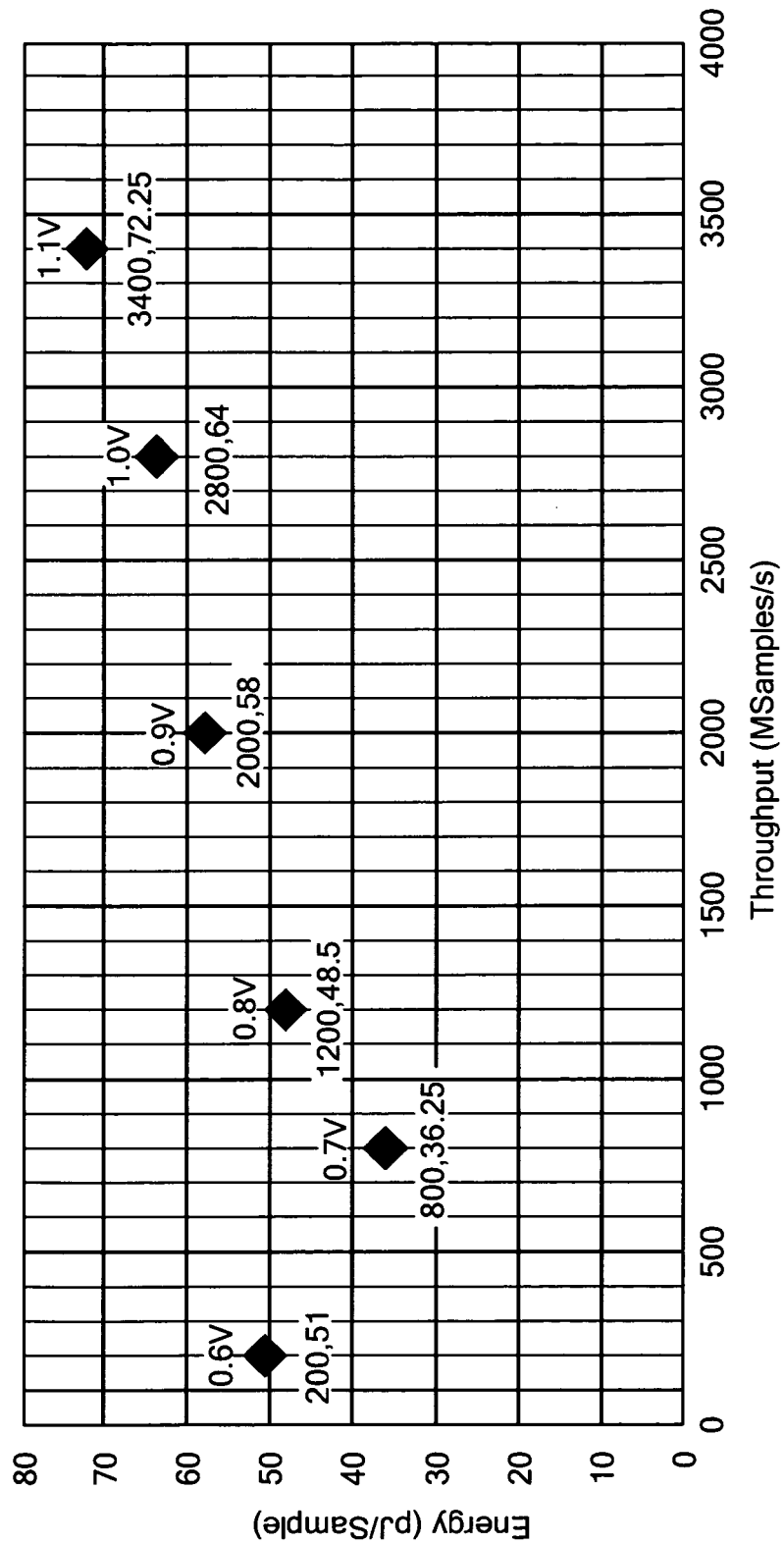
FIG. 9 is a plot of energy vs. throughput with supply scaling for an AMO SCS system.

In one exemplary embodiment, a digital AMO SCS system was fabricated as an integrated circuit using a 45 nm SOI process, with 448,578 gates occupying the area of 1.56 mm$^2$. The chip runs up to 1.7 GHz (3.4 Gsample/s) at 1.1 V supply. As shown in the shmoo plot of FIG. 9, lowering the power supply voltage decreases the dynamic power of the SCS digital system until it reaches a minimum-energy point at lower throughput, where leakage energy takes over. The minimum-energy point of 58 pJ per sample or 19 pJ per bit in 64-QAM transmission (assuming 2× oversampling) is measured at 800 MSamples/s throughput. For typical PA efficiency of 40% and throughput of 800 MSamples/s, at peak output power level of 1:8 W, the total peak PAE is affected by less than 1% (46 mW=(46 mW+1:8 W=0:4)) by this 64-QAM capable AMO SCS backend.

Figure 10:
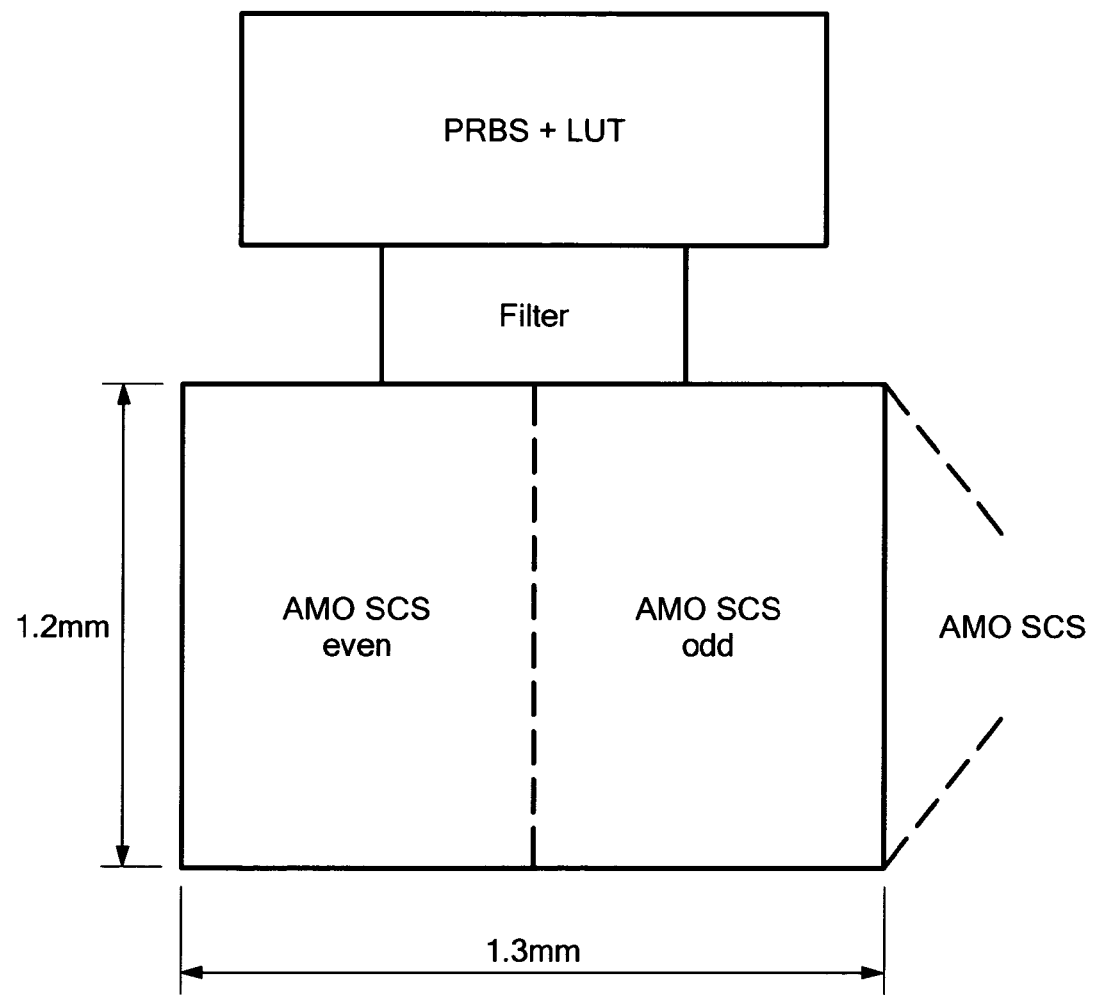
FIG. 10 is an image of an integrated circuit which implements an AMO SCS.

Referring now to FIG. 10, an image of an integrated circuit illustrates an AMO SCS having dimensions of 1.2 mm×1.3 mm.

where:

[13] L. Panseri, L. Romano, S. Levantino, C. Samori, and A. Lacaita, "Low-power signal component separator for a 64-qam 802.11 linc transmitter," *Solid-State Circuits, IEEE Journal of*, vol. 43, no. 5, pp. 1274-1286, may 2008.

[15] T.-W. Chen, P.-Y. Tsal, D. De Moitie, J.-Y. Yu, and C.-Y. Lee, "A low power all-digital signal component separator for uneven multi-level linc systems," in *ESSCIRC (ESSCIRC), 2011 Proceedings of the*, September 2011, pp. 403-406.

[19] T.-W. Chen, P.-Y. Tsai, J.-Y. Yu, and C.-Y. Lee, "A sub-mw all-digital signal component separator with branch mismatch compensation for OFDM linc transmitters," *Solid-State Circuits, IEEE Journal of*, vol. 46, no. 11, pp. 2514-2523, November 2011.

[23] B. Shi and L. Sundstrom, "An if cmos signal component separator chip for linc transmitters," in *Custom Integrated Circuits, 2001, IEEE Conference on.*, 2001, pp. 49-52.

The work described herein demonstrates a design approach which results in a circuit having the highest throughput and phase accuracy to date. To show a fair comparison with other digital AMO SCS designs, the design provided using the techniques described herein is scaled to provide the same phase accuracy, technology node and throughput. The scaled performances are summarized in the last 3 columns of the Table VII, and the design described herein shows more than 2× improvement in energy-efficiency and 25× improvement in area. As a general guideline, for applications with low/medium accuracy (e.g. less than 8-bit phase resolution) requirement and low/medium throughput (e.g. up to hundreds of MSamples/s), LUT is still a good design choice because of its low energy-efficiency, reasonable size and low design complexity. On the other hand, the FP PWL approximation approach described herein is preferred for applications with high accuracy (e.g. greater than 10-bit phase resolution) and high throughput (e.g. around GSamples/s) requirements.

Described herein are an FP PWL approximation approach and related techniques as well as an SCS and an integrated circuit design of a high-throughput (3.4 GSamples/s) SCS for an AMO PA architecture. In order to achieve energy- and area-efficient high-throughput operation, a novel fixed-point piece-wise linear approximation technique for computations of nonlinear functions in the SCS was used. This novel technique and the corresponding implementation can achieve over 2× improvement in energy efficiency and 25× improvement in area efficiency over conventional AMO SCS implementations. The technique is preferred since it includes relatively few and simple arithmetic operations, short arithmetic operands and small-sized look-up tables, and can be easily pipelined so as to allow operation at multi-GSamples/s throughputs. In one exemplary embodiment, an SCS was designed in 45 nm SOI technology. As noted above, although the approximation technique was demonstrated and described herein with an AMO SCS, the approximations are directly applicable to other circuits and applications including LINC SCS. Use of the fixed point PWL approximation technique with AMO and or LINC technology enables a new class of wideband wireless mm-wave communication system designs with high energy and spectral efficiency.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

The invention claimed is:

1. A circuit to implement a nonlinear function designed by representing the nonlinear function as a fixed point piece-wise linear (PWL) approximation, the circuit comprising:
 a look up table (LUT) stored in a memory of the circuit, the LUT configured to receive $m_1$ most significant bits (MSBs) and $m_2$ least significant bits (LSBs) of an input as an address and for providing parameters $b_i$, $k_i$, $S_i$ of a corresponding interval of the nonlinear function at an output thereof, where $b_i$ is a first fixed point value, $S_i$ is a second fixed point value, and $k_i$ is a third fixed point value, and where $k_i$ corresponds to a slope value of the nonlinear function in the corresponding interval;
 a multiplier of the circuit; and
 an adder of the circuit, said lookup table, said multiplier and said adder configured to implement the nonlinear function by representing the nonlinear function as a fixed point piece-wise linear (PWL) approximation, $y_i$, computed as:

$$y_1 = \underbrace{b_i \cdot 1}_{m_1-MSBbit} + \underbrace{k_i(x_2 - S_i \cdot 1)}_{m_2-LSBbit}, i = 0, 1, \ldots 2^{m_1} - 1,$$

in which:

$$y_i = [y([i, 0]), y([i, 1]), \ldots, y([i, N_2 - 1])]^T$$
$$x_2 = \frac{1}{N}[0, 1, \ldots, N_2 - 1]^T$$
$$1 = [1, 1, \ldots, 1]^T \in \mathbb{R}^{N_2}$$
$$N_1 = 2^{m_1}$$
$$N_2 = 2^{m_2}$$
$$N = 2^m$$
$$m = m_1 + m2.$$

2. The circuit of claim 1 wherein said LUT is hard-wired for one or more known functions.

3. The circuit of claim 1 wherein said LUT is programmable for changing nonlinear functions.

4. The circuit of claim 1 wherein said circuit is used in one of:
 (a) a communication system;
 (b) an automotive radar system;
 (c) an imaging system;
 (d) a satellite communication system;
 (e) a radar sensing system; or
 (f) an ultrasound sensing system.

5. The circuit of claim 1 wherein said circuit is used in one of:
 (a) a cell phone base station;
 (b) a cell phone;
 (c) a Wi-Fi radio;
 (d) a Wi-Max radio; or
 (e) a millimeter wave radio.

6. The circuit of claim 1 wherein the circuit is provided as a signal component separator circuit.

7. The circuit of claim 1 wherein the circuit is provided as a signal component separator (SCS) for use with an outphasing amplifier.

8. The circuit of claim 7 wherein said outphasing amplifier is provided as one of:
 (a) an asymmetric outphasing multilevel (AMO) amplifier and said SCS corresponds to AMO SCS; or
 (b) a linear-amplification-by-nonlinear-component (LINC) amplifier and said SCS corresponds to a LINC SCS.

* * * * *